(12) United States Patent
Ohnuma

(10) Patent No.: US 7,622,336 B2
(45) Date of Patent: Nov. 24, 2009

(54) MANUFACTURING METHOD OF SEMICONDUCTOR DEVICE

(75) Inventor: Hideto Ohnuma, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 99 days.

(21) Appl. No.: 11/645,521

(22) Filed: Dec. 27, 2006

(65) Prior Publication Data

US 2007/0148936 A1 Jun. 28, 2007

(30) Foreign Application Priority Data

Dec. 28, 2005 (JP) ............... 2005-379783

(51) Int. Cl.
*H01L 21/00* (2006.01)
*H01L 21/84* (2006.01)
*H01L 21/44* (2006.01)

(52) U.S. Cl. ............... 438/149; 438/116; 438/597; 438/637; 438/671; 438/761; 257/E21.038; 257/E21.039; 257/E21.314

(58) Field of Classification Search .......... 257/E21.038, 257/E21.039, E21.314

See application file for complete search history.

(56) References Cited

U.S. PATENT DOCUMENTS

| | | | |
|---|---|---|---|
| 5,573,890 A | 11/1996 | Spence | |
| 5,702,848 A | 12/1997 | Spence | |
| 5,766,804 A | 6/1998 | Spence | |
| 5,766,806 A | 6/1998 | Spence | |
| 5,945,237 A * | 8/1999 | Tanabe | 430/5 |
| 6,645,856 B2 * | 11/2003 | Tanaka et al. | 438/671 |
| 6,875,689 B2 * | 4/2005 | Wu | 438/671 |
| 2002/0006555 A1 * | 1/2002 | Hasegawa et al. | 430/5 |

(Continued)

FOREIGN PATENT DOCUMENTS

CN 1115876 1/1996

(Continued)

OTHER PUBLICATIONS

Suganuma et al., "A 200 nm X2 mm array of organic light-emitting diodes and their anisotropic electroluminescence", Applied Physics Letters, 1999 American Institute of Physics, Mar. 1, 1999, vol. 74, No. 9, pp. 1206-1208.

(Continued)

*Primary Examiner*—Charles D. Garber
*Assistant Examiner*—Mohsen Ahmadi
(74) *Attorney, Agent, or Firm*—Nixon Peabody LLP; Jeffrey L. Costellia

(57) ABSTRACT

To provide a manufacturing method of a semiconductor device with a reduced chip area by reducing the size of a pattern for forming an integrated circuit. For example, the size of an IC chip that is provided as an application of IC cards or IC tags can be reduced. The manufacturing method includes the steps of forming a gate electrode; forming an insulating layer over the gate electrode; and forming an opening in the insulating layer. One or both of the step of forming the gate electrode and the step of forming the opening in the insulating layer is/are conducted by a lithography process using a phase-shift mask or a hologram mask. Accordingly, micropatterns can be formed even over a substrate with low planarity such as a glass substrate.

13 Claims, 20 Drawing Sheets

U.S. PATENT DOCUMENTS

| | | | |
|---|---|---|---|
| 2002/0025591 A1 | 2/2002 | Ohnuma et al. | |
| 2003/0039896 A1* | 2/2003 | Iriguchi | 430/5 |
| 2004/0151993 A1* | 8/2004 | Hasegawa et al. | 430/5 |
| 2005/0001253 A1* | 1/2005 | Sugimura | 257/296 |
| 2005/0040531 A1* | 2/2005 | Kurokawa | 257/756 |
| 2005/0134463 A1 | 6/2005 | Yamazaki | |
| 2006/0014335 A1 | 1/2006 | Ohnuma et al. | |
| 2006/0186409 A1* | 8/2006 | Horino et al. | 257/59 |
| 2006/0240334 A1* | 10/2006 | Huh et al. | 430/5 |

FOREIGN PATENT DOCUMENTS

| | | |
|---|---|---|
| EP | 0698916 A | 2/1996 |
| JP | 05-005978 | 1/1993 |
| JP | 05-090130 | 4/1993 |
| JP | 2005-202947 | 7/2005 |

OTHER PUBLICATIONS

Chinese Office Action (Application No. 200610172809.8; CN9313) Dated May 22, 2009.

* cited by examiner

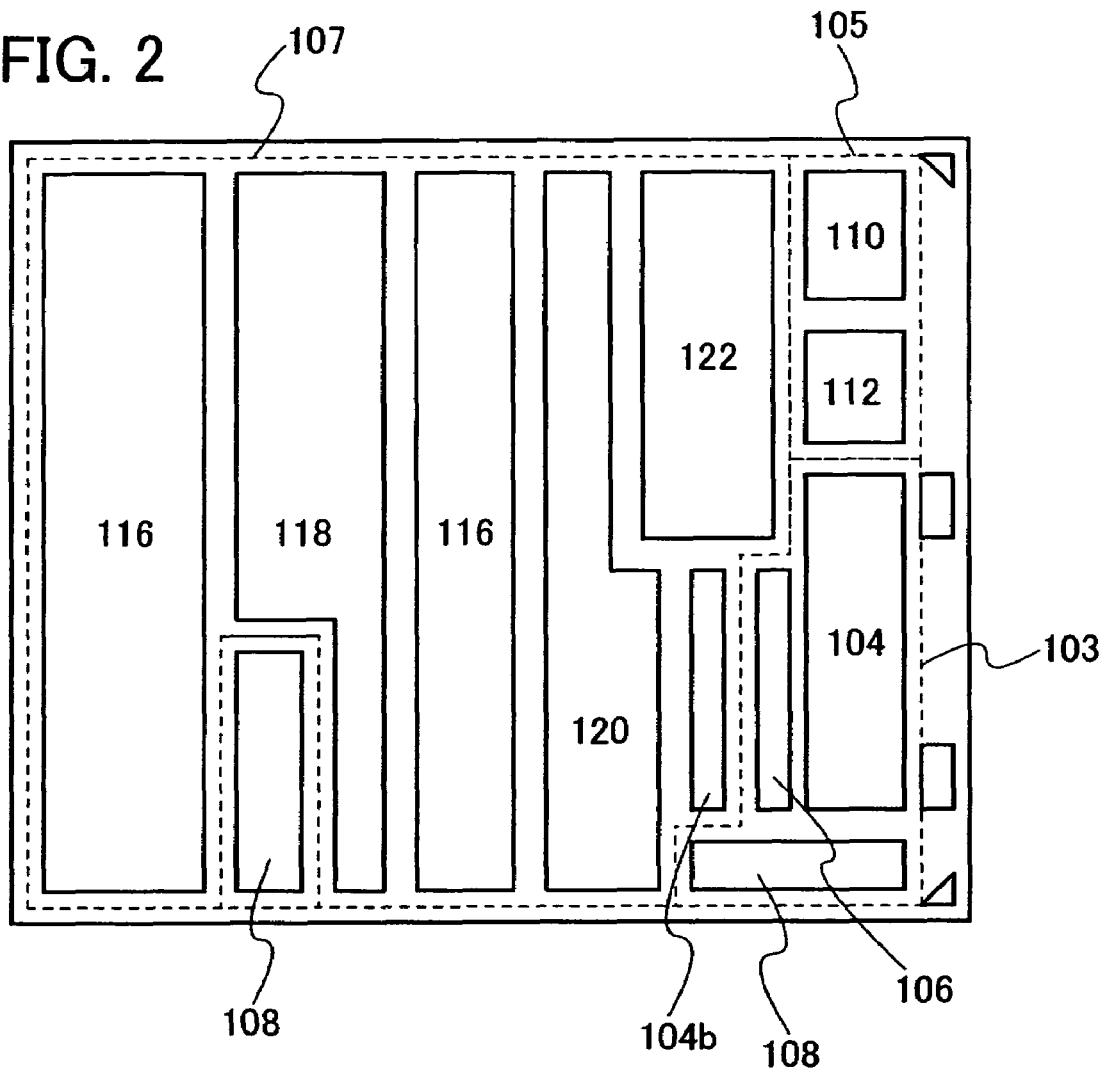

FIG. 18A
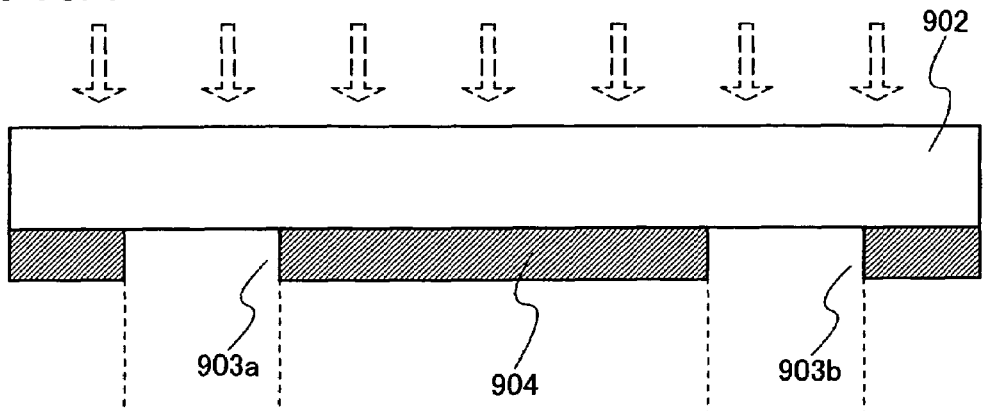
FIG. 18B
FIG. 18C
FIG. 18D
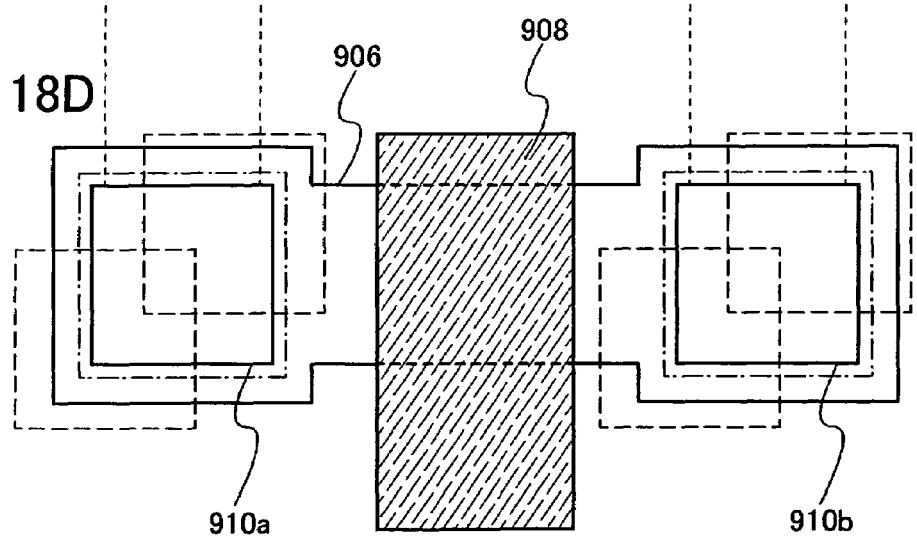

MANUFACTURING METHOD OF SEMICONDUCTOR DEVICE

BACKGROUND OF THE INVENTION

1. Field of the Invention

The present invention relates to a manufacturing method of a semiconductor device having an integrated circuit which includes transistors formed over an insulating surface. In particular, the invention relates to a manufacturing method of a semiconductor device using a high-resolution lithography technique.

2. Description of the Related Art

As a semiconductor device which performs transmission/reception of instructions or data with radio signals, a semiconductor device which includes an integrated circuit having thin film transistors (hereinafter also referred to as "TFTs") formed over a glass substrate as well as an antenna attached thereto is known (for example, see Reference 1: Japanese Published Patent Application No. 2005-202947).

Such a semiconductor device is called an IC card or an IC tag depending on the use or modes, and is planned to be used for identification of goods or individuals. That is, it has been attempted to introduce identification systems with higher data recording density into commercial transactions or safety control, replacing barcode systems that are widely used presently.

By the way, a conventional manufacturing process of a conventional semiconductor device requires a lithography process (i.e., photolithography process) for forming micropatterns such as wirings or contact holes. The lithography process includes the steps of (1) depositing a photoresist film over a substrate, (2) exposing the photoresist film to light through a mask having predetermined patterns, and (3) developing the photoresist film with a developer, thereby forming desired patterns of an integrated circuit.

FIGS. 18A to 18D illustrate a conventional lithography process. FIG. 18A is a cross-sectional view of a photomask 902 in which a light-shielding film 904 made of chrome or the like is formed on a light-transmissive substrate. Light that has traveled through an opening 903a of the photomask 902 has the same phase and amplitude distribution as light that has traveled through an opening 903b of the photomask 902, as shown in FIG. 18B. FIG. 18C shows light intensity distribution on the exposure surface. It can be seen that the edge of the opening 903a and the edge of the opening 903b have wide light intensity distribution due to diffraction of light.

FIG. 18D shows an example where a contact hole 910a and a contact hole 910b are formed in an interlayer insulating layer which is formed over a semiconductor layer 906 and a gate electrode 908. When of the openings 903a and 903b are 1.5 µm, sizes of the contact holes 910a and 910b are formed to have a longer size than 1.5 µm due to the influence of the light intensity distribution shown in FIG. 18C. Assuming that the possible misalignment of the photomask is approximately 0.5 µm, a mask pattern has to be designed to include a redundancy of approximately 0.5 µm in order to avoid misalignment of the contact holes 910a and 910b out of the semiconductor layer 906. That is, the conventional lithography process requires an extra margin due to low-resolution lithography, and thus it has limits on the miniaturization of integrated circuits.

SUMMARY OF THE INVENTION

It is said that the unit cost of IC cards or IC tags has to be reduced to 10 yen or less in order to promote the use of IC cards or IC tags throughout society. In order to reduce the unit cost of IC cards or IC tags, it is necessary to achieve high integration of an IC chip that is an essential component of the IC cards or IC tags and to reduce a chip area so that the number of chips that can be obtained from one substrate can be increased. In addition, the productivity of IC chips has to be improved by using a large-area glass substrate. However, since a thin glass substrate is slightly curved in the micro level, it has been difficult to form micropatterns through a lithography process which transfers patterns of a photomask.

In view of the foregoing, it is an object of the invention to provide a manufacturing method of a semiconductor device with a reduced chip area by reducing the size of a pattern for forming an integrated circuit. For example, the invention can reduce the size of an IC chip which includes thin film transistors and is provided as an application of IC cards or IC tags.

A manufacturing method of a semiconductor device in accordance with the invention includes the steps of: forming a gate electrode, forming an insulating layer over the gate electrode, and forming an opening in the insulating layer. One or both of the step of forming the gate electrode and the step of forming the opening in the insulating layer is/are conducted by a lithography process using a phase-shift mask.

A manufacturing method of a semiconductor device in accordance with the invention includes the steps of: forming a gate electrode, forming an insulating layer over the gate electrode, and forming an opening in the insulating layer. One of the step of forming the gate electrode and the step of forming the opening in the insulating layer is conducted by a lithography process using a phase-shift mask, and the other of the steps is conducted by a lithography process using a hologram mask.

In the invention, a phase-shift lithography method is used to form a pattern of a contact hole (specifically, a contact hole for connecting a semiconductor layer to a wiring layer) or a gate electrode, by which the degree of integration of an integrated circuit can be significantly improved. Accordingly, micropatterns can be formed in a wide area even over a substrate with low planarity such as a glass substrate.

That is, the degree of integration can be improved by forming patterns of wirings, contact holes, and the like that are necessary for an integrated circuit by use of a phase-shift lithography method or a holographic lithography method, within the resolution limit of lithography.

In the case of opening a contact hole, a contact area located under the contact hole can be designed with a smaller margin. That is, a redundant area which can accommodate a misalignment of a contact hole can be reduced.

In the case of a pattern such as a memory cell array in which transistors are periodically arranged, the distance between adjacent gates (gate pitch) can be reduced.

BRIEF DESCRIPTION OF THE DRAWINGS

In the accompanying drawings;

FIG. 2 shows an exemplary circuit layout of a semiconductor device which has the configuration and function of FIG. 1;

FIGS. 18A to 18D illustrate a conventional lithography method;

DETAILED DESCRIPTION OF THE INVENTION

Figure 1:
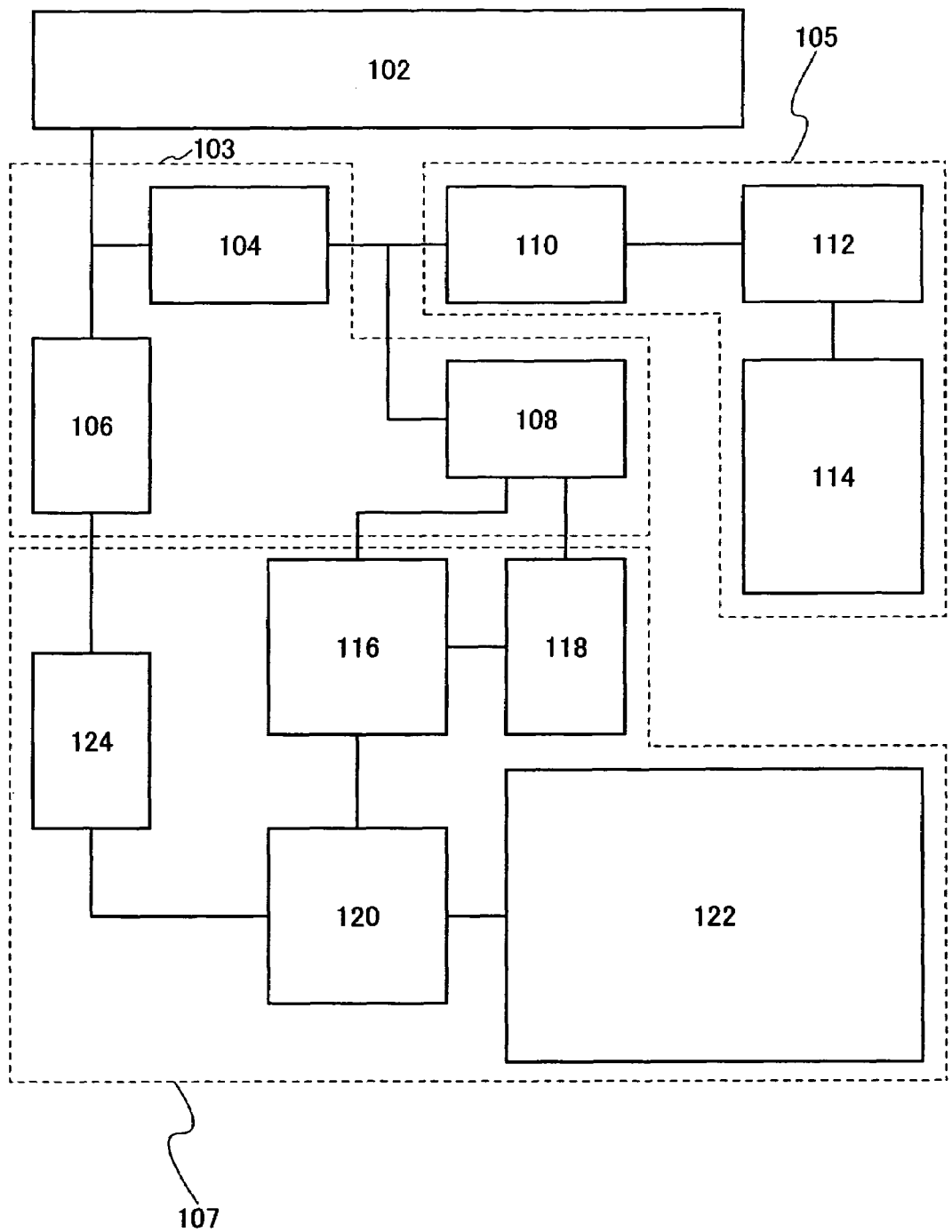
FIG. 1 is a block diagram showing an exemplary configuration of a semiconductor device which can perform transmission/reception of instructions or data with radio signals.

In a manufacturing method of a semiconductor device in accordance with the invention, a phase-shift lithography method or a holographic lithography method which uses a hologram mask or a computer-generated hologram mask is used as a lithography process for forming an integrated circuit. In the following description, a "hologram mask" includes a computer-generated hologram mask in its category. A hologram mask is a mask formed by recording fringe patterns that are produced by optical interference between an object beam and a reference beam. A computer-generated hologram mask is a hologram mask which is directly formed by computer-calculating fringe patterns that are produced by optical interference between an object beam and a reference beam. A lithography process includes the steps of photoresist coating, light exposure, development, and the like in order to form patterns of an integrated circuit such as wirings or contact holes.

The manufacturing method of a semiconductor device includes a step of forming a gate electrode, a step of forming an insulating layer over the gate electrode, and a step of forming an opening which penetrate the insulating layer. In this method, one or both of the step of forming the gate electrode and the step of forming the opening in the insulating layer is/are conducted by a lithography process using a phase-shift mask. Alternatively, one or both of the above steps may be conducted by a holographic lithography method using a hologram mask. As a further alternative, one of the steps may be conducted by a lithography method using a phase-shift mask, while the other of the steps may be conducted by a holographic lithography method using a hologram mask.

One aspect of a manufacturing method of a semiconductor device in accordance with the invention includes a step of forming a gate electrode over a semiconductor layer with an insulating layer interposed therebetween, a step of forming an interlayer insulating layer over the gate electrode, a step of forming a contact hole in the interlayer insulating layer, and a step of forming a wiring layer over the interlayer insulating layer and in the contact hole. In this method, one or both of the step of forming the gate electrode and the step of forming the contact hole is/are conducted by a lithography process using a phase-shift mask. Alternatively, one or both of the above steps may be conducted by a holographic lithography method using a hologram mask. As a further alternative, one of the steps may be conducted by a lithography method using a phase-shift mask, while the other of the steps may be conducted by a holographic lithography method using a hologram mask.

The above-described manufacturing method of a semiconductor device may further include a step of forming a second wiring layer over the wiring layer with a second interlayer insulating layer interposed therebetween. In that case, formation of a contact hole in the second interlayer insulating layer may be conducted by a phase-shift lithography method or a holographic lithography method.

In the lithography process using the phase-shift mask, a large depth of focus can be ensured even for a substrate with low planarity such as a glass substrate, by using an image-reducing projection system (stepper) or a 1:1 projection system (aligner). Furthermore, a mask pattern with micro features can be formed in a wide area in a short time. Such a lithography process using the phase-shift mask may be conducted with a magnification ratio of equal to or more than 1:1.

Although the above description shows an example where a lithography process using a phase-shift mask or a lithography process using a hologram mask is used for formation of a gate electrode or a contact hole, such process may also be applied to formation of a semiconductor layer, formation of a mask which defines a doping region, and/or other lithography steps. Furthermore, the lithography process using the phase-shift mask or the lithography process using the hologram mask may be applied to all lithography steps that are included in the manufacturing process of a semiconductor device. However, such a process is preferably applied to formation of a gate electrode or a contact hole in consideration of mask cost and throughput.

Miniaturization of a gate electrode can be achieved by forming a mask pattern of the gate electrode by using the phase-shift lithography method or the holographic lithography method. In addition, miniaturization of a contact hole can be achieved by forming a mask pattern of the contact hole by using the phase-shift lithography method or the holographic lithography method. Accordingly, in the case of a pattern such as a memory cell array in which transistors are periodically arranged, the distance between adjacent gates (gate pitch) can be reduced.

The invention can provide a semiconductor device having an integrated circuit which includes thin film transistors whose channel formation regions are formed from a semiconductor layer which is formed over a substrate with an insulating surface. This semiconductor device includes an integrated circuit in which various patterns such as wirings and contact holes are formed by a high-resolution lithography technique such as a phase-shift lithography method or a holographic lithography method in order to achieve miniaturization. That is, the semiconductor device has an integrated circuit where small contact holes are opened in an insulating layer over a glass substrate, and thin film transistors are arranged with a narrow gate pitch.

As an example of the above-described semiconductor device, the invention can provide a semiconductor device which includes an RF circuit portion connected to an antenna for receiving radio signals, a logic circuit portion for processing information such as instructions or data received, and a memory portion for storing data transmitted from outside or individual identification data.

In the invention, a semiconductor device refers to all devices that function by utilizing semiconductor characteristics. Specifically, the semiconductor device includes functional devices such as microprocessors and image processors, storage devices such as memories, and electronic devices having the same. In addition, the semiconductor device can be applied to a manufacturing process of a display device which utilizes an electrooptic property of liquid crystals or a display device which utilizes a light-emitting property such as electroluminescence.

Although embodiment modes of the invention will be described in detail below with reference to the accompanying drawings, it is to be understood that various changes and modifications will be apparent to those skilled in the art. Therefore, unless such changes and modifications depart from the spirit and scope of the invention, they should be construed as being included therein. Thus, the invention is not limited to the description of the following embodiment modes. In the structure of the invention described below, like reference numerals are used to designate identical portions or portions having a similar function in different drawings, and thus their repetitive description may be omitted.

As one embodiment mode of the invention, a semiconductor device which can perform transmission/reception of instructions or data with radio signals is described with reference to the drawings.

Semiconductor Device Which is One Embodiment Mode of the Invention

FIG. 1 is a block diagram showing one exemplary configuration of a semiconductor device which can perform transmission/reception of instructions or data with radio signals. This semiconductor device includes an antenna portion 102, an RF circuit portion 103, a power supply circuit portion 105, and a logic circuit portion 107. The antenna portion 102 communicates signals with a communication device which is also called a reader/writer. Frequencies of carrier waves for delivering signals can be LF bands (1 to 135 kHz), HF bands (6.78 MHz, 13.56 MHz, 27.125 MHz, 40.68 MHz, or 5.0 MHz), microwave bands (2.45 GHz, 5.8 GHz, or 24.125 GHz), or the like. The antenna portion 102 can have either a coiled shape, monopole shape, or dipole shape depending on the communication frequency.

Carrier waves that the antenna portion 102 has received are divided into the power supply circuit portion 105 and the logic circuit portion 107 through a detection capacitor portion 104. In the power supply circuit portion 105, the carrier waves are half-wave rectified by a rectifier circuit portion 110, and then charged in a storage capacitor portion 112. A constant voltage circuit portion 114 outputs a constant voltage regardless of whether it has received power of more than a certain level relative to the power of the carrier waves received, and supplies power which is necessary to operate the logic circuit portion 107 or the like within the semiconductor device.

A demodulation circuit portion 108 in the RF circuit portion 103 demodulates the carrier waves to generate clock signals that are necessary to operate the logic circuit portion 107, and outputs the clock signals to a PLL circuit portion 118 which has a function of correcting the clock signals and to a code recognition/judgment circuit portion 116. For example, the demodulation circuit portion 108 detects an amplitude fluctuation of "0" or "1" as reception data from an ASK (Amplitude Shift Keying) modulated reception signal. The demodulation circuit portion 108 includes a low-pass filter, for example. In addition, a modulation circuit portion 106 transmits transmission data as an ASK modulated transmission signal.

The code recognition/judgment circuit portion 116 recognizes and judges instruction codes. Instruction codes that are recognized and judged by the code recognition/judgment circuit portion 116 include a frame termination signal (EOF, End Of Frame), a frame start signal (SOF, Start Of Frame), a flag, a command code, a mask length, a mask value, and the like. The code recognition/judgment circuit 116 also includes a cyclic redundancy check (CRC) function for discriminating send errors. A judgment result by the code recognition/judgment circuit portion 116 is output to a memory controller portion 120. The memory controller portion 120 controls data reading from a memory portion 122 based on the judgment result. Data which is read out from the memory portion 122 is encoded by an encoding circuit portion 124. Then, the modulation circuit portion 106 modulates the encoded data to generate a response signal.

The memory portion 122 may include a mask ROM (Read Only Memory) which stores only fixed data, a memory which can be read and written at arbitrary timing such as an SRAM (Static Random Access Memory), a nonvolatile memory which has a floating electrode for accumulating electric charges, and the like.

In this manner, the semiconductor device shown in FIG. 1 has a function of writing data to or reading data from the memory portion 122 by receiving instructions from a communication device which is also called a reader/writer.

An exemplary circuit layout of a semiconductor device which has the above configuration and function is described with reference to FIG. 2. The rectifier circuit portion 110 and the storage capacitor portion 112 which partially constitute the power supply circuit portion 105 are provided close to each other. The demodulation circuit portion 108 in the RF circuit portion 103 and the code recognition/judgment circuit portion 116 in the logic circuit portion 107 can be divided into a plurality of sections. The demodulation circuit portion 108 is provided between the PLL circuit portion 118 and the code recognition/judgment circuit portion 116. In addition, influences of noise can be suppressed by providing the PLL circuit portion 118 and the code recognition/judgment circuit portion 116 to be adjacent to each other. Although the detection capacitor portion 104 is provided in the RF circuit portion 103, another detection capacitor portion 104b is separately provided in the logic circuit portion 107. The modulation circuit portion 106 is provided between the two detection capacitor portions of 104 and 104b.

In order to form a mask ROM in the memory portion 122, a circuit is formed by using electron beam lithography or laser beam lithography. Since the electron beam lithography or the laser beam lithography can write different data to the mask ROM in accordance with programs, different identification data can be stored in each chip.

In order to form a fuse-type organic memory or a phase-change organic memory as a write-once memory in the memory portion 122, a write circuit is provided in the memory controller portion 120. In the case of writing data into such an organic memory at the time of manufacturing this semiconductor device, a circuit layout may include an electrode for applying a voltage for data writing.

Such a semiconductor device can be formed by using MOS transistors on a single crystalline silicon substrate. Alternatively, the semiconductor device may be formed by using thin film transistors over an insulating substrate such as glass, in view of the degree of freedom of external shapes and productivity.

That is, in order to spread such a semiconductor device which is capable of wireless data transmission/reception throughout society, it is vital to lower the manufacturing cost. However, building a new production line using a manufacturing technique of semiconductor integrated circuits involves a large amount of equipment investment, and thus a cost reduction is difficult to achieve. For example, building a production line for 12-inch wafers requires an equipment investment of approximately 150 billion yen. Furthermore, considering a running cost, it is quite difficult to suppress the unit cost down to 100 yen or less. A 12-inch wafer has an area of approximately 73,000 mm². Therefore, even when neglecting a margin width of approximately 100 μm which is necessary for cutting the wafer with a dicing machine having a blade with a width of approximately 20 to 50 μm, only 73,000 chips with a size of 1 mm×1 mm or 182,500 chips with a size of 0.4 mm×0.4 mm can be obtained. Therefore, it is very difficult to secure sufficient supply quantities.

Meanwhile, in the case of manufacturing the semiconductor device by using thin film transistors over an insulating substrate such as glass, a large-area substrate can be used. However, if miniaturization of circuits is not enough and a chip area is large, it is difficult to sufficiently lower the unit cost. Thus, this embodiment mode adopts a lithography process which can form micropatterns even over a glass substrate or the like.

Phase-shift Lithography Method

In order to form micropatterns even over a glass substrate or the like as described above, a phase-shift lithography method with a half-tone phase-shift mask is employed. This method can partially invert the phase of light by using a phase shifter which is provided on a photomask, so that the edge contrast of an optical image such as a circuit pattern can be improved. That is, a phase-shift mask which has a main pattern (isolated contact-hole pattern or the like) and an auxiliary pattern having an inverted phase around the main pattern is employed. Thus, a phase difference is produced between light that has traveled through the main pattern and light that has traveled through the auxiliary pattern.

Figure 3A:
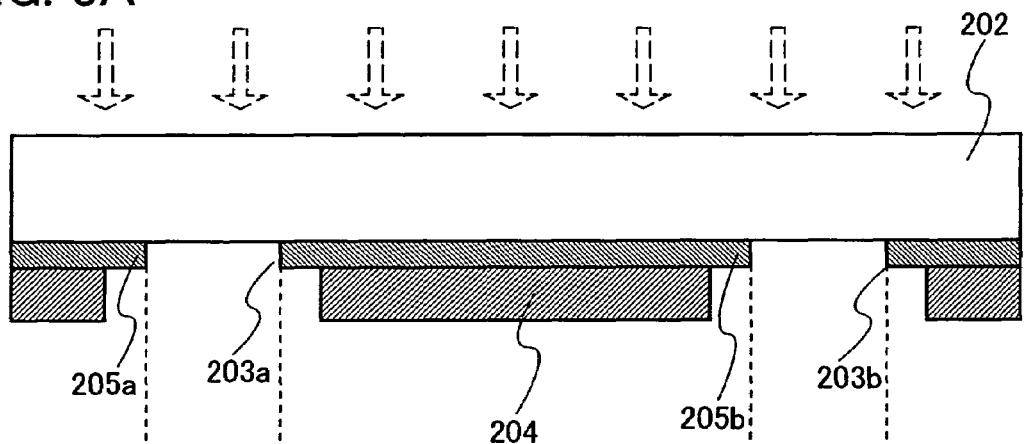
FIGS. 3A to 3D illustrate an example of a phase-shift lithography method.
Figure 3B:
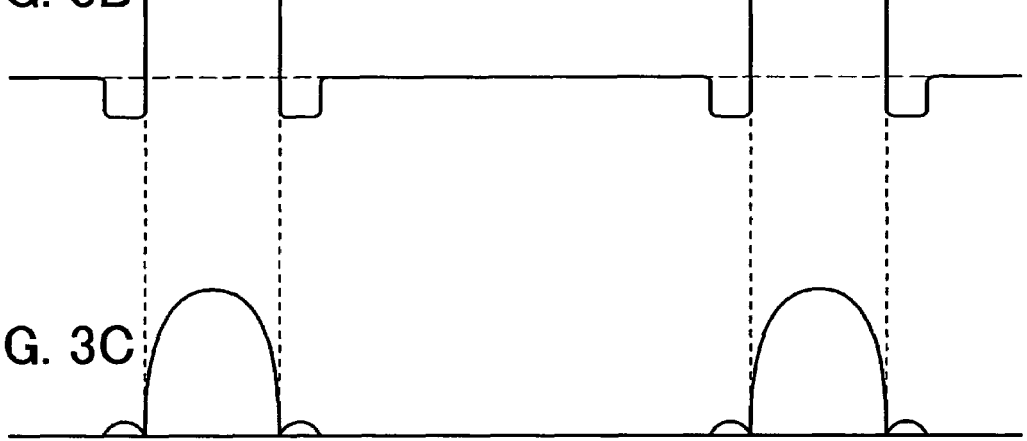

FIGS. 3A to 3D illustrate an example of a phase-shift lithography method. FIG. 3A is a cross-sectional view of a photomask 202 in which a light-shielding film 204 made of chrome or the like and phase shifters 205a and 205b are formed on a light-transmissive substrate. The light-shielding film 204 is provided with an opening 203a and an opening 203b, which correspond to the main pattern. The phase shifters 205a and 205b are provided around the opening 203a and the opening 203b, which correspond to the auxiliary pattern. Phase-shift films and the like are used as the phase-shifters 205a and 205b in order to set the phase shift and transmission factor. For example, the phase shift is set at 180±5 degrees, and the transmission factor is set in the range of 4 to 8%. As a phase-shift film, an oxide film of Cr or an oxide film of MoSi; a SiO₂ film; a thin Cr film; or a stack of such films is used.

The light that has traveled through the openings 203a and 203b of the photomask 202 has inverted amplitude distribution from the light that has traveled through the adjacent phase shifters 205a and 205b. The amplitude distribution of the light that has traveled through the openings 203a and 203b is given by the Bessel function, and has several high-order peaks around the central zero-order peak. Center positions of the phase shifters 205a and 205b are set to overlap with the maximum peak with the same phase among the above high-order peaks. Accordingly, the bottom portion of the light intensity distribution of the main pattern is offset by the peripheral auxiliary pattern having the opposite phase. Thus, the light intensity distribution of the main pattern can be effectively narrowed.

Figure 3C:

By narrowing the bottom spread of the light intensity distribution of the main pattern, light intensity distribution as shown in FIG. 3C can be obtained, in which the edge contrast on the exposure surface is sharp. Thus, the bottom portion of the light intensity distribution of the openings 203a and 203b which are the main pattern can be offset by the peripheral auxiliary pattern having the opposite phase, and the light intensity distribution of the main pattern can be effectively narrowed. Further, the amplitude distribution of the light that has traveled through the phase shifters 205a and 205b has high-order peaks not only in its central portion but also in its peripheral portion. When positions of the peaks overlap with the positions of the original openings 203a and 203b, light intensity around the central portion of the main pattern becomes strong; therefore, the contrast of the light intensity distribution is increased. As a result, the resolution and the depth of focus of the openings 203a and 203b can be increased.

Figure 3D:
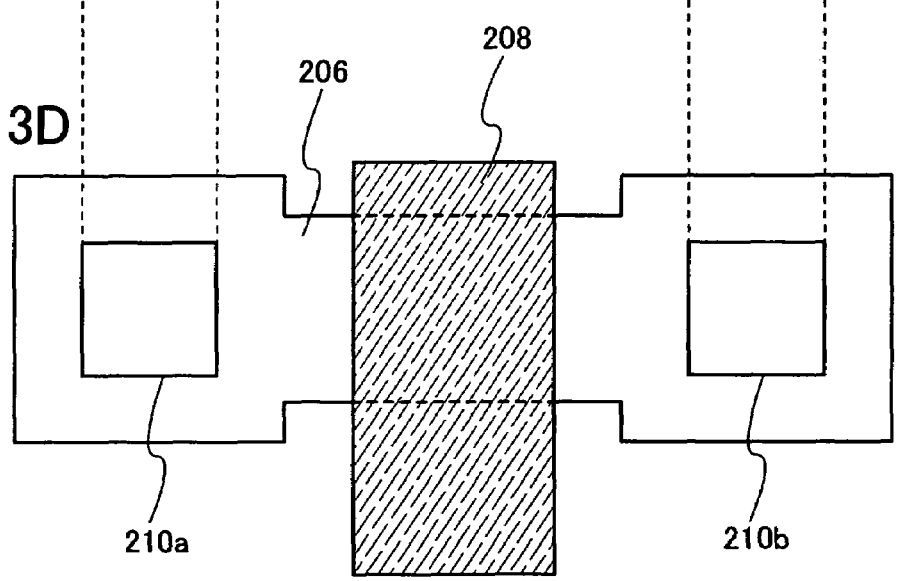

FIG. 3D shows an example where contact holes 210a and 210b are formed in an interlayer insulating layer which is formed over a semiconductor layer 206 and a gate electrode 208. Since this phase-shift method can increase the resolution without changing the wavelength of light which is used for lithography, the conventional resolution as low as 1.5 μm can be improved to be approximately 1 μm. Thus, even when the openings 203a and 203b are formed to have a size of 1 μm, the layout of the semiconductor layer 206 does not have to include an extra margin. That is, miniaturization can also be achieved for an integrated circuit over an insulating substrate made of glass or the like.

Figure 4A:
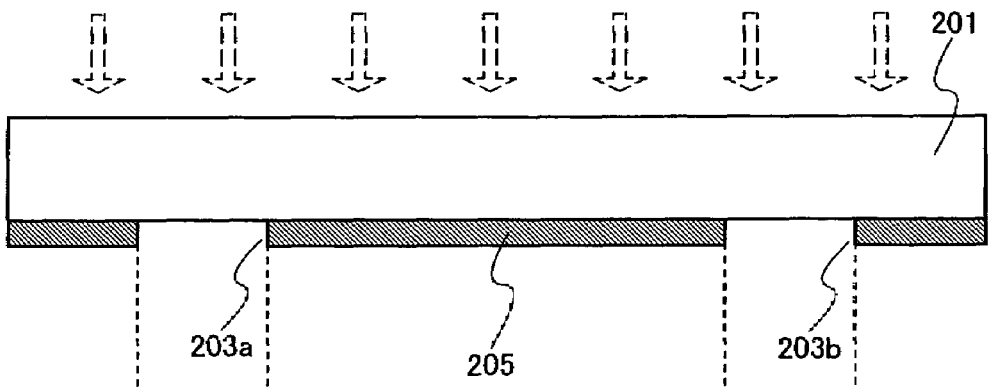
FIGS. 4A to 4D illustrate an example of a phase-shift lithography method.
Figure 4B:
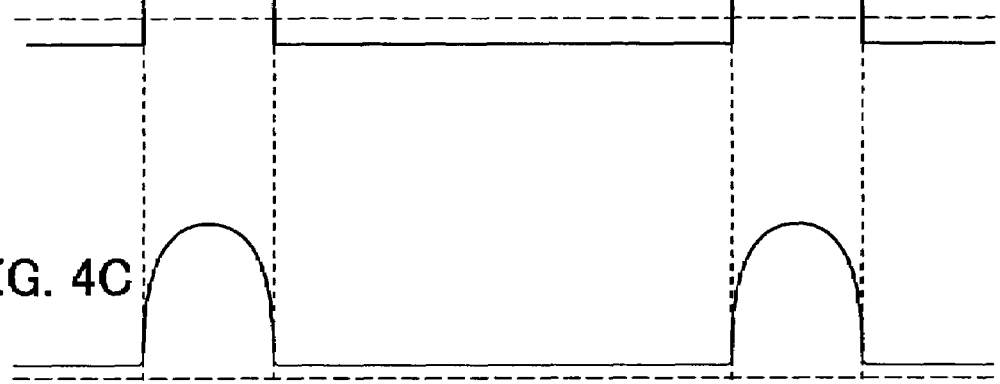
Figure 4C:
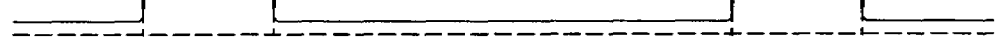
Figure 4D:
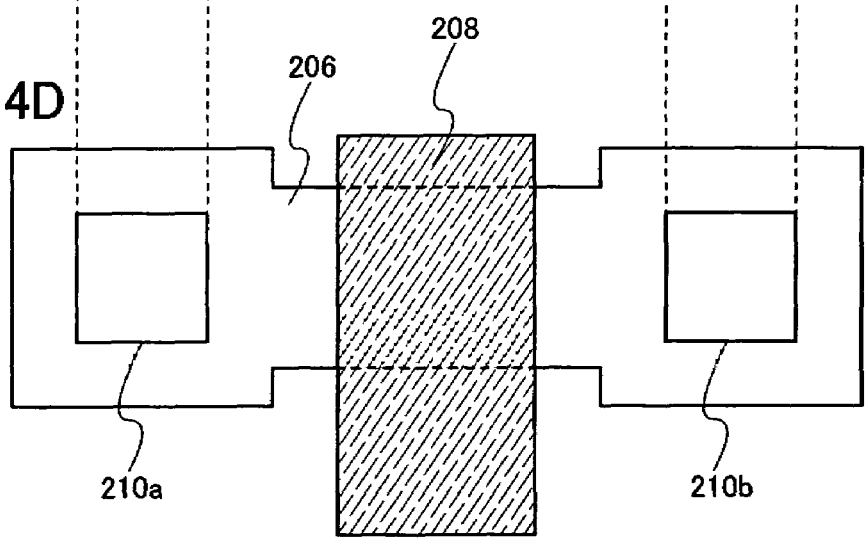

FIG. 4A to 4D illustrate another example of a phase-shift lithography method like FIGS. 3A to 3D. FIG. 4A is a cross-sectional view of the photomask 202 in which a phase shifter 205 having the openings 203a and 203b are formed on a light-transmissive substrate. A phase shifted by the phase shifter 205 is set at, for example, 180±5 degrees, and the transmission factor of the phase shifter 205 is set in the range of 4 to 8%. In this case, the light that has traveled through the openings 203a and 203b has inverted amplitude distribution from the light that has traveled through the adjacent phase shifter 205. Accordingly, light intensity distribution as shown in FIG. 4C can be obtained, in which the edge contrast on the exposure surface is sharp. FIG. 4D shows an example where the contact holes 210a and 210b are formed in the interlayer insulating layer which is formed over the semiconductor layer 206 and the gate electrode 208. In this case also, a similar effect to that in FIG. 3 can be obtained, and micro contact-hole patterns can be formed.

Although FIGS. 3A through 4D illustrate examples where contact-hole patterns for the semiconductor layer 206 are formed, the above description can be applied to printing of various patterns that are necessary for forming integrated circuits by lithography, such as electrodes, wirings, and semiconductor layers.

In the lithography process using the phase-shift mask, an image-reducing projection system such as a stepper can be used. However, a stepper has a disadvantage in that the depth of focus becomes smaller as the resolution becomes higher. For a substrate with low planarity such as a glass substrate, it is preferable to use a 1:1 projection system. By using a 1:1 projection system, processing time can be reduced even in the case of using a large-area glass substrate.

Holographic Lithography

A holographic lithography method is used to form micropatterns even over a glass substrate or the like. A holographic lithography method is a lithography technique using the principle of holograms. This lithography method can print a pattern of a hologram mask onto a wafer having a resist layer formed on its surface, through light exposure. A hologram mask is a mask that records fringe patterns, which is formed through the steps of illuminating an original plate (photomask) which records integrated circuit patterns with a laser beam (object beam) to produce diffraction, while at the same time illuminating the rear surface of a hologram recording plate with a coherent laser beam (reference beam) so that the reference beam interferes with the object beam and the resulting fringe patterns are recorded in the hologram mask. In the lithography process, the hologram mask is illuminated with an exposure beam (replay beam) so that a diffraction beam for reconstructing the original pattern is delivered to a photoresist layer. A hologram mask has an advantage of high resolution because it is free from aberrations in principle.

A hologram mask records data on the phase of light; therefore, the principle of a phase-shift mask may be adopted to form a mask pattern with a sharp edge. It is also possible to employ a hologram mask which records mask data and has a phase shifter or employ a hologram mask which utilizes a phase-shift effect on the exposure surface. Accordingly, a mask layer with even smaller micropatterns can be formed.

Embodiment Mode 1

A manufacturing method of a semiconductor device using the above-described lithography technique which is capable of micropattern formation is described with reference to the drawings. In the following description, a static random access memory (SRAM) having six transistors is illustrated as an example of a memory cell.

Inputs of inverters 301 and 302 in this SRAM are connected to bit lines BL1 and BL2 through switches S1 and S2, respectively. The switches S1 and S2 are controlled by a row selection signal which is delivered through a word line WL. Each of the inverters 301 and 302 is supplied with power from a high voltage VDD and a low voltage GND which is generally grounded. In order to write data into the memory cell, the voltage VDD is applied to one of the bit lines BL1 and BL2, while the voltage GND is applied to the other of the bit lines BL1 and BL2.

The inverter 301 includes an n-channel transistor N1 and a p-channel transistor P1 which are connected in series. A source of the p-channel transistor P1 is connected to the voltage VDD, while a source of the n-channel transistor N1 is connected to the voltage GND. Drains of the p-channel transistor P1 and the n-channel transistor N1 are connected to each other at a node 305A. Gates of the p-channel transistor P1 and the n-channel transistor N1 are connected to each other at a node 306A. Similarly, the inverter 302 includes a p-channel transistor P2 and an n-channel transistor N2 which are connected in a similar manner to the p-channel transistor P1 and the n-channel transistor N1. Gates of the p-channel transistor P2 and the n-channel transistor N2 are connected to each other at a node 306B, while common drains of the p-channel transistor P2 and the n-channel transistor N2 are connected to each other at a node 305B.

Figure 5:
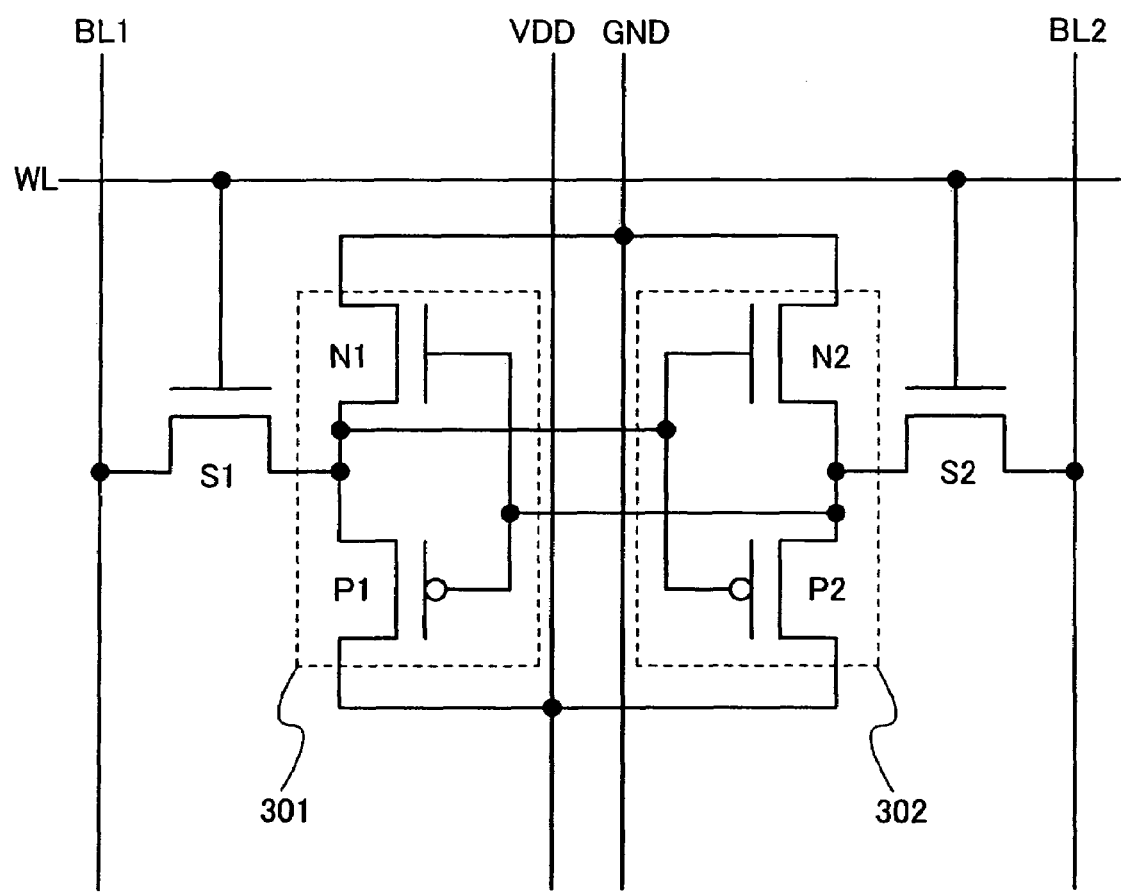
FIG. 5 is a circuit diagram of a static random access memory.

The SRAM shown in FIG. 5 is operated such that input/output states of the inverters 301 and 302 are set by turning on the switches S1 and S2. Next, when the switches S1 and S2 are turned off, signal states of the inverters 301 and 302 are retained. In order to read out data from the memory cell, each of the bit lines BL1 and BL2 is precharged to be in the voltage range of VDD to GND. When the switches S1 and S2 are turned on, voltages of the bit lines change in accordance with the signal state of the inverters 301 and 302. Data stored in the memory cell is read out by a sense amplifier which is connected to each bit line.

Figure 6:
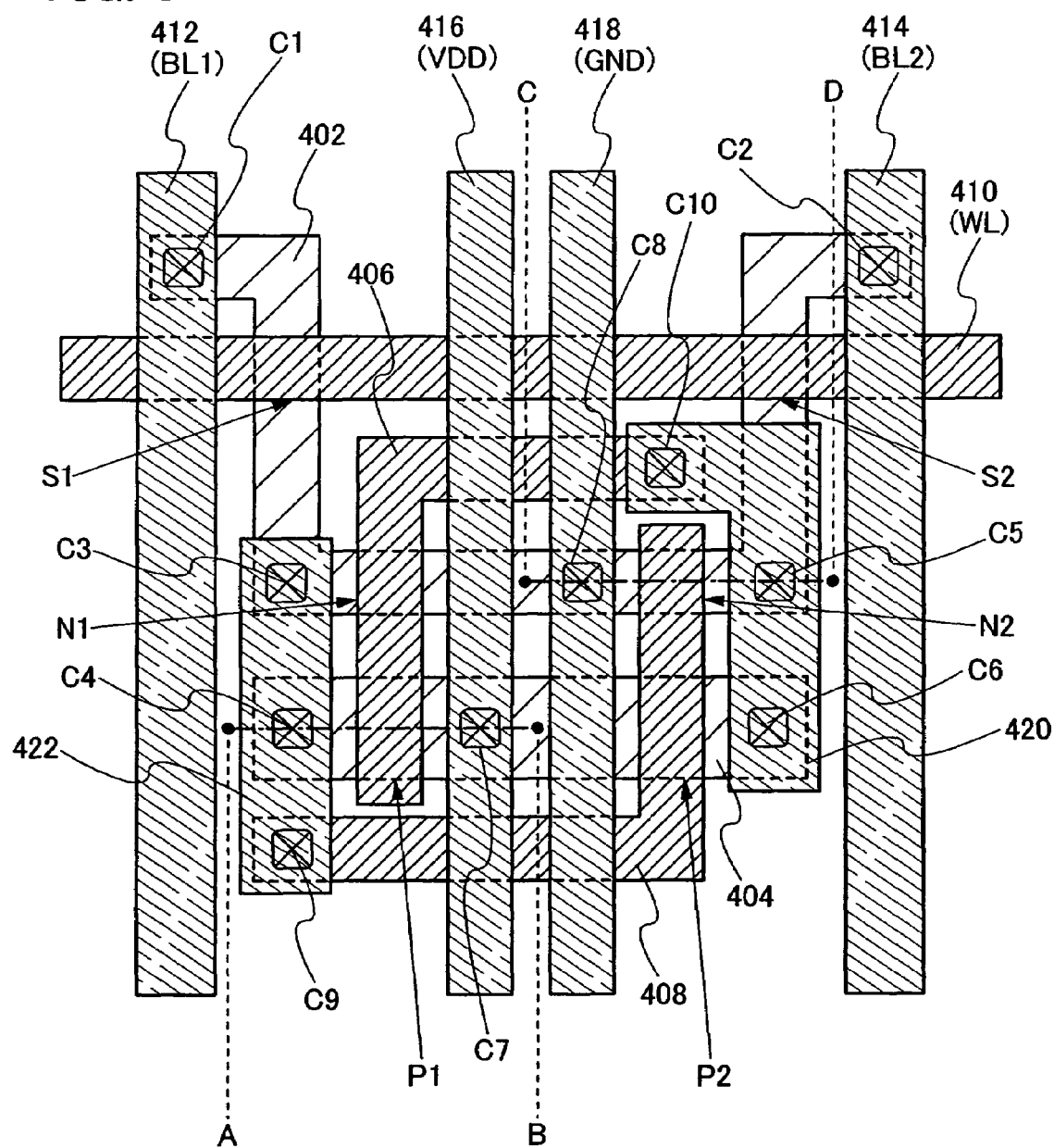
FIG. 6 illustrates an exemplary circuit layout of a static random access memory.

FIG. 6 shows an exemplary circuit layout of the SRAM shown in FIG. 5. FIG. 6 shows an SRAM which includes a semiconductor layer and two wiring layers including a gate wiring layer. Given that a semiconductor layer 402 for forming n-channel transistors and a semiconductor layer 404 for forming p-channel transistors are located in the lower layer, first wiring layers 406, 408, and 410 are located above the lower layer with an insulating layer interposed therebetween. The first wiring layer 406 is a layer for forming gate electrodes, which forms the n-channel transistor N1 and the p-channel transistor P1 by intersecting the semiconductor layers 402 and 404, respectively. The first wiring layer 408 is a layer for forming gate electrodes, which forms the n-channel transistor N2 and the p-channel transistor P2 by intersecting the semiconductor layers 402 and 404, respectively. The first wiring layer 410 is a word line (WL), which forms the switches S1 and S2 by intersecting the semiconductor layer 402. In this manner, the first wiring layers 406, 408, and 410 form gate electrodes with the semiconductor layers 402 and 404.

Second wiring layers 412, 414, 416, and 418 are formed over the first wiring layers 406, 408, and 410 with an insulating layer interposed therebetween. The second wiring layer 412 forms a bit line (BL1); the second wiring layer 414 forms a bit line (BL2); the second wiring layer 416 forms a power supply line (VDD); and the second wiring layer 418 forms a ground potential line (GND).

A contact hole C1 is an opening formed in the insulating layer, which connects the second wiring layer 412 to the semiconductor layer 402. A contact hole C2 is an opening formed in the insulating layer, which connects the second wiring layer 414 to the semiconductor layer 402. A contact hole C3 is an opening formed in the insulating layer, which connects a second wiring layer 422 to the semiconductor layer 402. A contact hole C4 is an opening formed in the insulating layer, which connects the second wiring layer 422 to the semiconductor layer 404. A contact hole C5 is an opening formed in the insulating layer, which connects a second wiring layer 420 to the semiconductor layer 402. A contact hole C6 is an opening formed in the insulating layer, which connects the second wiring layer 420 to the semiconductor layer 404. A contact hole C7 is an opening formed in the insulating layer, which connects the second wiring layer 416 to the semiconductor layer 402. A contact hole C8 is an opening formed in the insulating layer, which connects the second wiring layer 418 to the semiconductor layer 404. A contact hole C9 is an opening formed in the insulating layer, which connects the second wiring layer 422 to the first wiring layer 408. A contact hole C10 is an opening formed in the insulating layer, which connects the second wiring layer 420 to the first wiring layer 406. In this manner, the SRAM shown in FIG. 5 is formed with the contact holes C1 to C10 which connect the semiconductor layers, the first wiring layers, and the second wiring layers.

A manufacturing process of such an SRAM is described with reference to FIG. 7 which is a cross-sectional view along a line A-B (the p-channel transistor P1) and a line C-D (the n-channel transistor N2) of FIG. 6.

Figure 7:
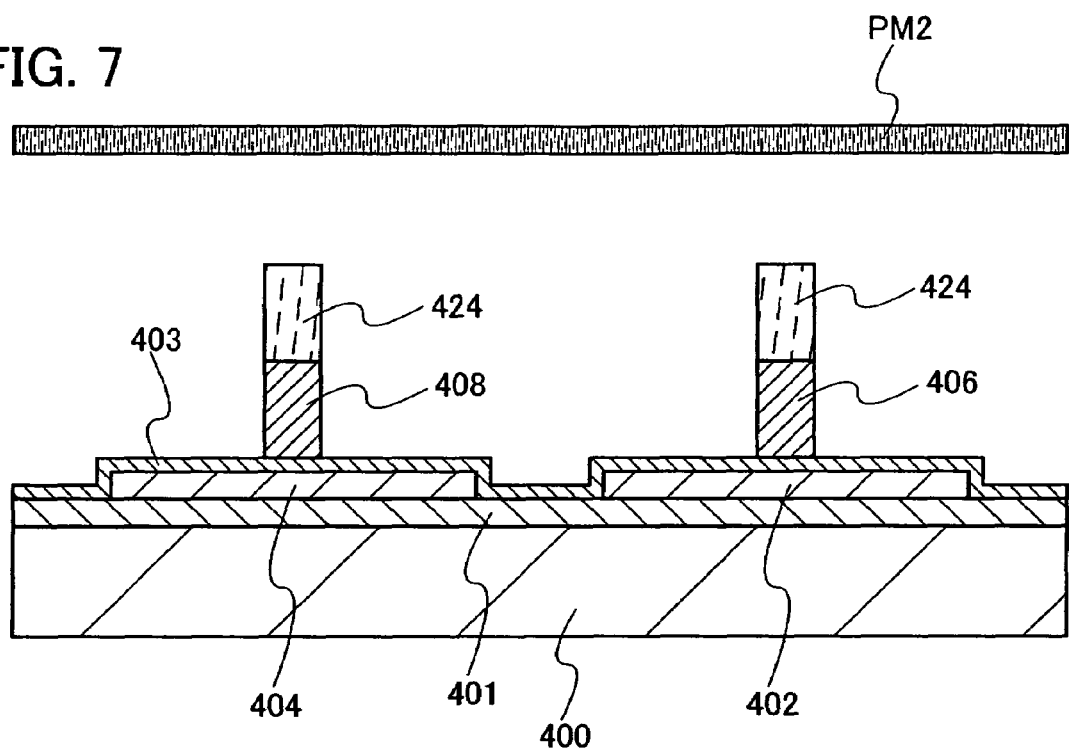
FIG. 7 illustrates a manufacturing process of a semiconductor device in accordance with Embodiment Mode 1.

Referring to FIG. 7, a substrate 400 is selected from a glass substrate, a quartz substrate, a metal substrate (e.g., a ceramic substrate or a stainless steel substrate), a semiconductor substrate such as a Si substrate, and the like. Alternatively, the substrate 400 may be a plastic substrate made of polyethylene terephthalate (PET), polyethylene naphthalate (PEN), polyethersulfone (PES), a substrate made of acrylic, or the like.

A first insulating layer 401 is formed over the substrate 400 as a blocking layer against impurities. The first insulating layer 401 serves as a base film for the semiconductor layers 402 and 404. When the substrate 400 is made of quartz, the first insulating layer 401 may be omitted.

The first insulating layer 401 is formed by a CVD method or a sputtering method, using an insulating material such as silicon oxide, silicon nitride, silicon oxynitride ($SiO_xN_y$), (x>y>0), or silicon nitride oxide ($SiN_xO_y$) (x>y>0). For example, when the first insulating layer 401 is formed to have a two-layer structure, it is preferable to form a silicon nitride oxide film as a first-layer insulating film, and form a silicon oxynitride film as a second-layer insulating film. Alternatively, a silicon nitride film may be formed as a first-layer insulating film and a silicon oxide film may be formed as a second-layer insulating film. In this manner, formation of the first insulating layer 401 which functions as a blocking layer can prevent adverse effects of alkaline metals such as Na or alkaline earth metals contained in the substrate 400 which would otherwise be diffused to elements formed over the substrate.

Each of the semiconductor layers 402 and 404 is preferably formed of a crystalline semiconductor layer. The crystalline semiconductor layer may be any of a layer which is obtained by crystallizing an amorphous semiconductor layer formed over the first insulating layer 401 by thermal treatment or laser beam irradiation; a layer which is obtained by processing a crystalline semiconductor layer formed over the first insulating layer 401 to have an amorphous state, and then recrystallizing it again; and the like.

In the case of conducting crystallization or recrystallization by laser beam irradiation, an LD-pumped continuous wave (CW) laser (e.g., $YVO_4$ with a second harmonic (wavelength of 532 nm)) can be used as a laser light source. Although the wavelength is not specifically limited to the second harmonic, the second harmonic is superior to harmonics higher than that in terms of energy efficiency. When a semiconductor film is irradiated with CW laser, continuous energy can be given to the semiconductor film. Therefore, once the semiconductor film is made into a molten state, the molten state can be retained. Further, by scanning the semiconductor film with CW laser, a solid-liquid interface of the semiconductor film can be moved, and crystal grains which are long in one direction can be formed along the moving direction. The reason for using a solid-state laser is to obtain more stable output than by using a gas laser or the like, and thus more stable treatment can be expected. Note that the laser light source is not limited to a CW laser and a pulsed laser with a repetition rate of 10 MHz or higher can be used as well. When a pulsed laser with a high repetition rate is used, a semiconductor film can be constantly retained in the molten state on the condition that a pulse interval of laser is shorter than a time interval from the point when a semiconductor film is melted until the point when the semiconductor film becomes solidified. Thus, a semiconductor film with crystal grains which are long in one direction can be formed by moving the solid-liquid interface. It is also possible to employ other types of CW lasers or pulsed lasers with a repetition rate of 10 MHz or higher. For example, gas lasers such as an Ar laser, a Kr laser, and a $CO_2$ laser can be used, or slid-state lasers such as a YAG laser, a YLF laser, a $YAlO_3$ laser, a $GdVO_4$ laser, a KGW laser, a KYW laser, an alexandrite laser, a Ti:sapphire laser, a $Y_2O_3$ laser, and a $YVO_4$ laser can be used. In addition, ceramic lasers such as a YAG laser, a $Y_2O_3$ laser, a $GdVO_4$ laser, and a $YVO_4$ laser can also be used. As a metal vapor laser, helium-cadmium laser and the like can be given as examples. Laser beams are preferably emitted from a laser oscillator with $TEM_{00}$ (single transverse mode), which can increase the energy uniformity of a linear beam spot that is obtained on the irradiation surface. Besides, a pulsed excimer laser can also be used.

A second insulating layer 403 used as a gate insulating layer is formed using silicon oxide, silicon nitride, silicon oxynitride ($SiO_xN_y$) (x>y>0), silicon nitride oxide ($SiN_xO_y$) (x>y>0), or the like. Such an insulating layer is formed by a vapor growth method or a sputtering method. Alternatively, the second insulating layer 403 used as a gate insulating layer can be formed by performing high-density plasma treatment such as oxidation treatment or nitridation treatment to the surface of the semiconductor layers 402 and 404 under an oxygen atmosphere (e.g., an atmosphere containing oxygen ($O_2$) and rare gas (at least one of He, Ne, Ar, Kr, and Xe), or an atmosphere containing oxygen, hydrogen ($H_2$), and rare gas); or a nitrogen atmosphere (e.g., an atmosphere containing nitrogen ($N_2$) and rare gas (at least one of He, Ne, Ar, Kr, and Xe), an atmosphere containing nitrogen, hydrogen, and rare gas, or an atmosphere containing $NH_3$ and rare gas). By oxidizing or nitriding the surface of the semiconductor layers 402 and 404 by the high-density plasma treatment to form the second insulating layer 403, defect level density which would trap electrons or holes can be reduced.

The first wiring layers 406 and 408 to be used as the gate electrodes are formed from a high-melting-point metal such as tungsten, molybdenum, titanium, tantalum, chrome, or niobium. Alternatively, an alloy of the above metal such as an alloy of molybdenum and tungsten, titanium nitride, or tungsten nitride; a conductive metal nitride; or a conductive metal oxide can be used. Further, a stacked structure of tantalum nitride and tungsten can be used. It is also possible to use polysilicon which is doped with impurity elements such as phosphorus.

The first wiring layers 406 and 408 to be used as the gate electrodes are formed through the steps of depositing the above-described conductive layer over almost the entire surface of the second insulating layer 403; forming a mask layer 424 by using a photomask (PMG); and etching the conductive layer with the mask layer 424. The mask layer 424 is formed by a lithography process. When the lithography process is conducted by using a photomask (PMG) which has the phase-shift mask described with reference to FIGS. 3A through 4D, the first wiring layers 406 and 408 to be used as minute gate electrodes can be formed even over a glass substrate with low planarity. For example, the first wiring layers 406 and 408 to be used as the gate electrodes can be formed to have a gate length of approximately 1 μm by the lithography process using the phase-shift mask, even when using a 1:1 projection system with 1.5-μm resolution at the i line (365 nm).

Figure 8:
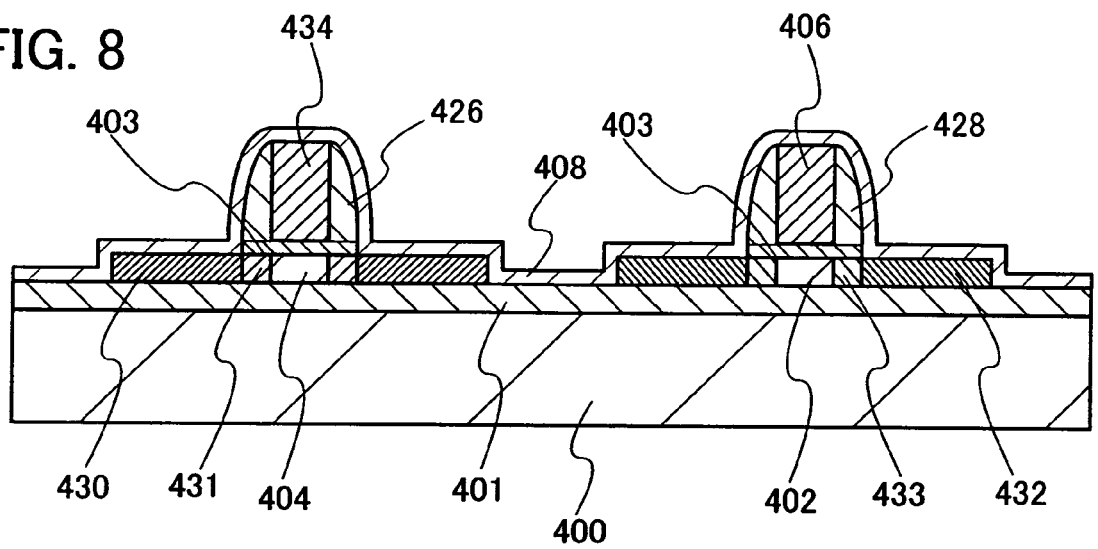
FIG. 8 illustrates a manufacturing process of a semiconductor device in accordance with Embodiment Mode 1.

Referring to FIG. 8, sidewalls 426 and 428 are formed on opposite sides of the first wiring layers 406 and 408, respectively. Then, a third insulating layer 434 is formed as a passivation layer. The third insulating layer 434 is formed using silicon nitride, silicon oxynitride ($SiO_xN_y$) (x>y>0), silicon nitride oxide ($SiN_xO_y$) (x>y>0), or the like. An n-type impurity region 432 functioning as a source or a drain is formed in the semiconductor layer 402. Further, a so-called lightly doped drain (LDD) region 433 may be formed by utilizing the sidewall 428. In addition, a p-type impurity region 430 functioning as a source or a drain is formed in the semiconductor layer 404. It is also possible to form a so-called lightly doped drain (LDD) region 431 by utilizing the sidewall 426.

Figure 9:
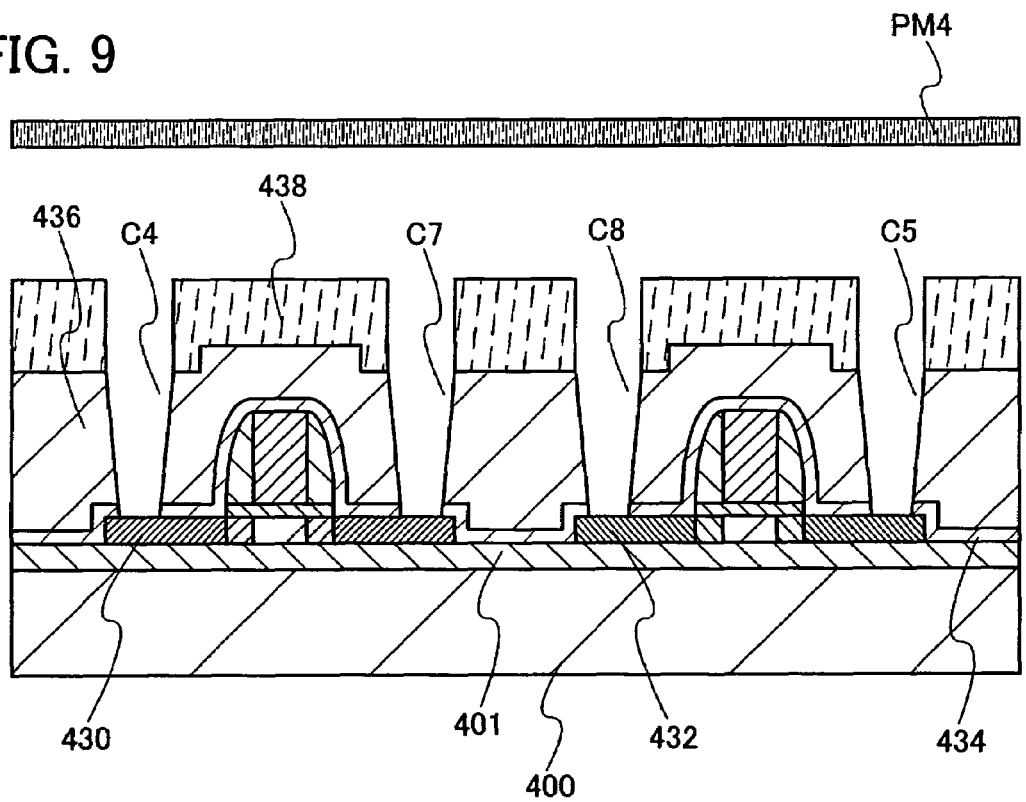
FIG. 9 illustrates a manufacturing process of a semiconductor device in accordance with Embodiment Mode 1.

FIG. 9 shows a step of forming a fourth insulating layer 436 and a step of forming the contact holes C4, C5, C7, and C8. The fourth insulating layer 436 is formed by a vapor growth method such as plasma CVD or thermal CVD or a sputtering method, using silicon oxide, silicon oxynitride ($SiO_xN_y$) (x>y>0), silicon nitride oxide ($SiN_xO_y$) (x>y>0), or the like. Alternatively, the fourth insulating layer 436 can be formed to have a single-layer structure or a stacked-layer structure including an organic material such as polyimide, polyamide, polyvinyl phenol, benzocyclobutene, acrylic, or epoxy; a siloxane material such as a siloxane resin; oxazole resin; and the like. Note that siloxane is a material having a skeletal structure with the bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group containing at least hydrogen may be used as the substituent. Oxazole resin includes, for example, photosensitive polybenzoxazole or the like. Photosensitive polybenzoxazole is a material having a low dielectric constant (dielectric constant of 2.9 at 1 MHz at room temperature), high heat resistance (thermal decomposition temperature of 550° C. with a temperature rise of 5° C./min by TGA (Thermal Gravity Analysis)), and a low water absorption percentage (0.3% at room temperature). Oxazole resin has a lower dielectric constant (approximately 2.9) as compared with a dielectric constant of polyimide or the like (approximately 3.2 to 3.4). Therefore, generation of parasitic capacitance can be suppressed and high-speed operation can be performed.

The contact holes C4, C5, C7, and C8 which penetrate the third insulating layer 434 and the fourth insulating layer 436 to expose the n-type impurity region 432 and the p-type impurity region 430 are formed by using a mask layer 438. The mask layer 438 is formed by a lithography process. When the lithography process is conducted by using the photomask (PMG) which has the phase-shift mask described with reference to FIGS. 3A through 4D, the mask layer 438 having contact holes with minute sizes can be formed even over a glass substrate with low planarity. For example, the mask layer 438 can be formed to have a contact hole with a size of approximately 1 µm by using the phase-shift mask even when using a 1:1 projection system with 1.5-µm resolution at the i line (365 nm). After that, by etching the third insulating layer 434 and the fourth insulating layer 436 with the mask layer 438, the contact holes C4, C5, C7, and C8 can be formed.

Figure 10:
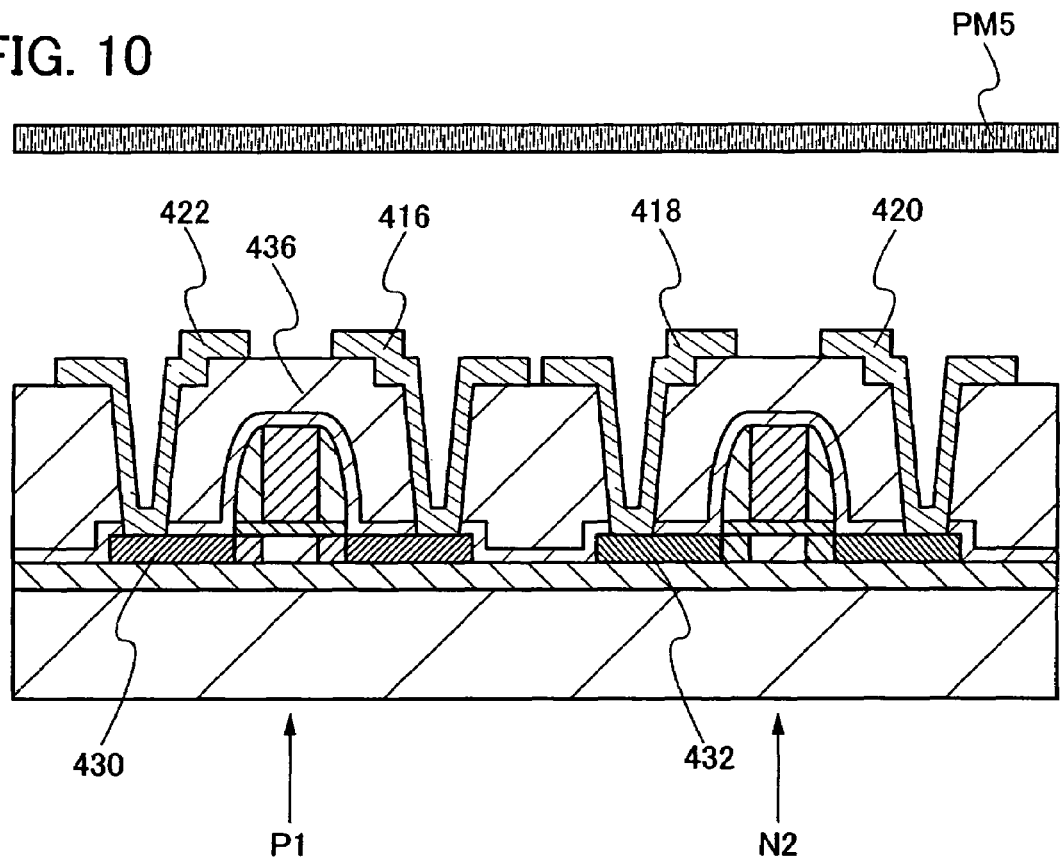
FIG. 10 illustrates a manufacturing process of a semiconductor device in accordance with Embodiment Mode 1.

FIG. 10 shows a step of forming the second wiring layers 416, 418, 420, and 422. The second wiring layers 416, 418, 420, and 422 can be formed to have a single-layer structure or a stacked-layer structure of an element selected from aluminum, tungsten, titanium, tantalum, molybdenum, nickel, and neodymium (Nd), or an alloy containing a plurality of such elements. For example, an aluminum alloy containing titanium, an aluminum alloy containing neodymium, or the like can be used as a conductive film which is made of an alloy containing a plurality of the above-described elements. In the case of forming a stacked-layer structure, for example, a structure where an aluminum layer or the above-described aluminum alloy layer is sandwiched between titanium layers can be used. The second wiring layer 416 forms the power supply line (VDD), while the second wiring layer 418 forms the ground potential line (GND).

By forming a contact hole with a small size using the phase-shift mask, a contact area of the semiconductor layers 402 and 404 with the second wiring layers 416, 418, 420, and 422 can be reduced. Accordingly, intervals of the adjacent contact holes can be narrowed, and thus the degree of integration can be improved.

As described above, Embodiment Mode 1 illustrates a manufacturing process of the p-channel transistor P1 and the n-channel transistor N2 which are included in the circuit layout shown in FIG. 6. It is also possible to form other transistors in a similar way. Note that this embodiment mode illustrates an example of using a phase-shift mask for formation of gate electrodes and contact holes. However, a lithography process using such a phase-shift mask can have a similar effect even when it is applied to formation of one of the gate electrodes and the contact holes, in terms of improving the degree of integration. Furthermore, a phase-shift mask can also be applied to a lithography process which is required for forming a semiconductor layer or a wiring layer.

Embodiment Mode 2

Figure 11:
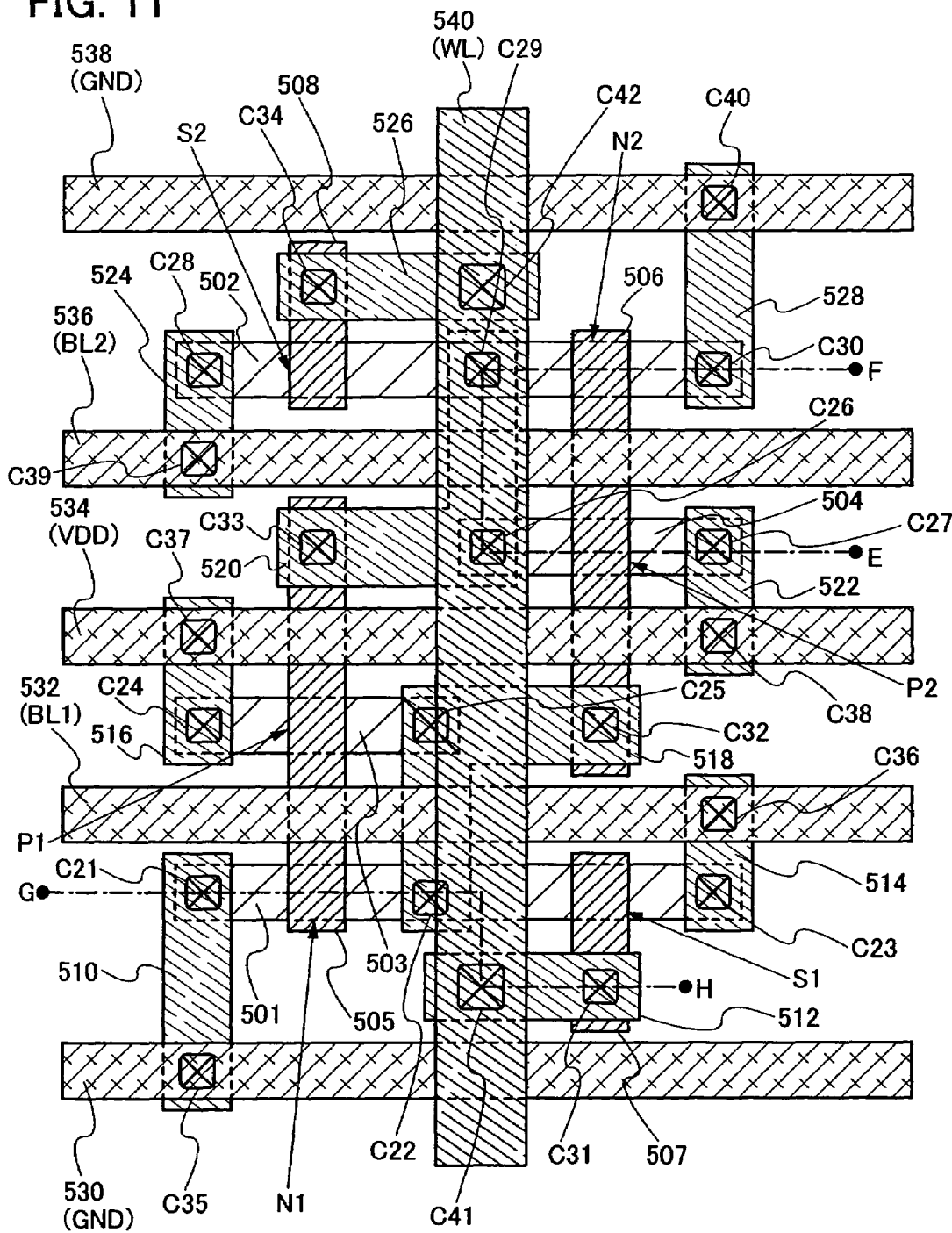
FIG. 11 illustrates an exemplary circuit layout of a static random access memory.

FIG. 11 shows another example of a circuit layout of the SRAM shown in FIG. 5. FIG. 11 shows an SRAM having a semiconductor layer, a gate electrode layer, and three wiring layers. The SRAM includes semiconductor layers 501 and 502 for forming n-channel transistors, and semiconductor layers 503 and 504 for forming p-channel transistors. Further, gate electrode layers 505, 506, 507, and 508 functioning as gate wiring layers are provided over the semiconductor layers 501, 502, 503, and 504 with an insulating layer interposed therebetween. Thus, the n-channel transistors N1 and N2, the p-channel transistors P1 and P2, and the switches S1 and S2 are formed.

First wiring layers 510, 512, 514, 516, 518, 520, 522, 524, 526, and 528 which contact the gate electrode layers are provided over a first interlayer insulating layer. Second wiring layers 532 and 536 for forming bit lines and second wiring layers 530 and 538 for forming ground potential lines are provided over a second interlayer insulating layer. Further, a third wiring layer 540 for forming a word line is provided over a third interlayer insulating layer.

Contact holes C21 to C30 form contacts between the first wiring layers and the semiconductor layers, and are provided in the first interlayer insulating layer. Contact holes C31 to C40 form contacts between the second wiring layers and the first wiring layers, and are provided in the second interlayer insulating layer. Contact holes C41 and C42 form contacts between the third wiring layers and the first wiring layers, and are provided in the first interlayer insulating layer and the second interlayer insulating layer. Thus, the SRAM shown in FIG. 5 is formed.

Next, a manufacturing process of such an SRAM is described with reference to FIG. 12 which is a cross-sectional view along a line E-F (the p-channel transistor P2 and the n-channel transistor N2) of FIG. 11.

Figure 12:
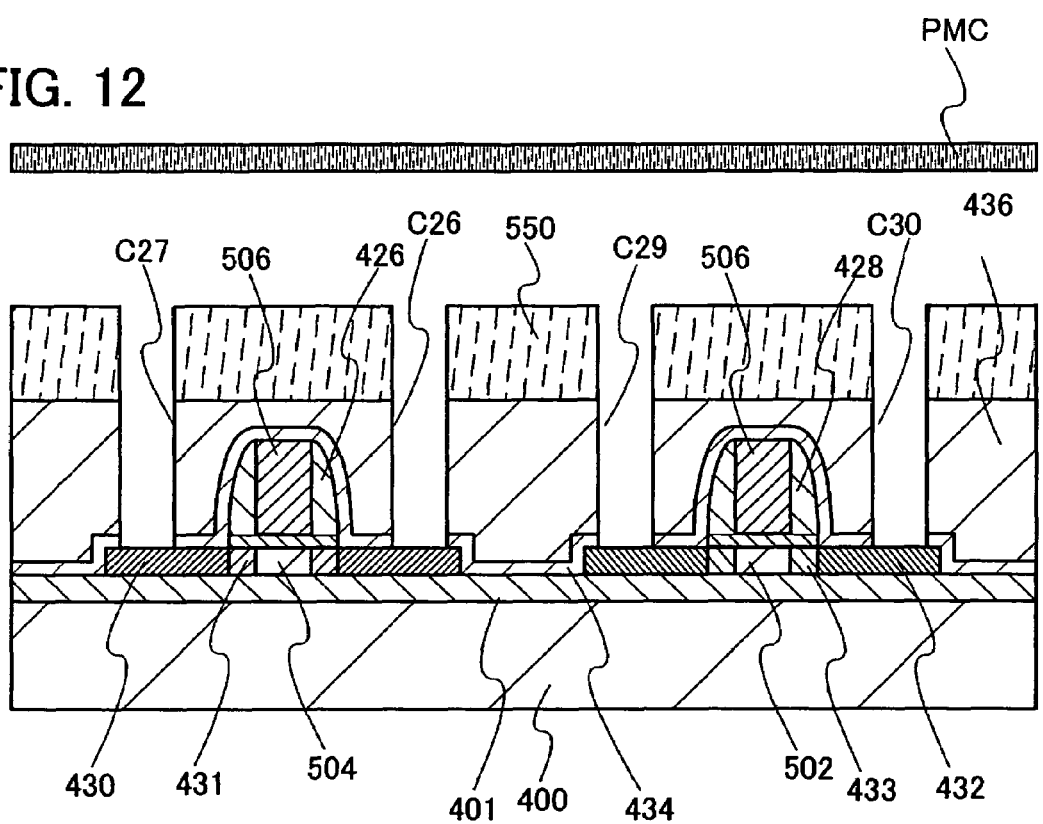
FIG. 12 illustrates a manufacturing process of a semiconductor device in accordance with Embodiment Mode 2.

Referring to FIG. 12, a first insulating layer 401, semiconductor layers 502 and 504, a second insulating layer 403, a gate electrode layer 506, sidewalls 426 and 428, a third insulating layer 434, and a fourth insulating layer 436 which are formed over a substrate 400 are formed in a similar way to Embodiment Mode 1.

The contact holes C26, C27, C29, and C30 which penetrate the third insulating layer 434 and the fourth insulating layer 436 to expose an n-type impurity region 432 and a p-type impurity region 430 are formed by an etching process using a mask layer 550. The mask layer 550 is formed by a lithography process. When the lithography process is conducted by using the photomask (PMG) which has the phase-shift mask described with reference to FIGS. 3A through 4D, the mask layer 550 having contact holes with minute sizes can be formed even over a glass substrate with low planarity. For example, the mask layer 550 can be formed to have a contact hole with a size of approximately 1 µm by using the phase-shift mask even when using a 1:1 projection system with 1.5-µm resolution at the i line (365 nm). After that, by etching the third insulating layer 434 and the fourth insulating layer 436 with such mask layer 550, the contact holes C4, C5, C7, and C8 can be formed.

Figure 13:
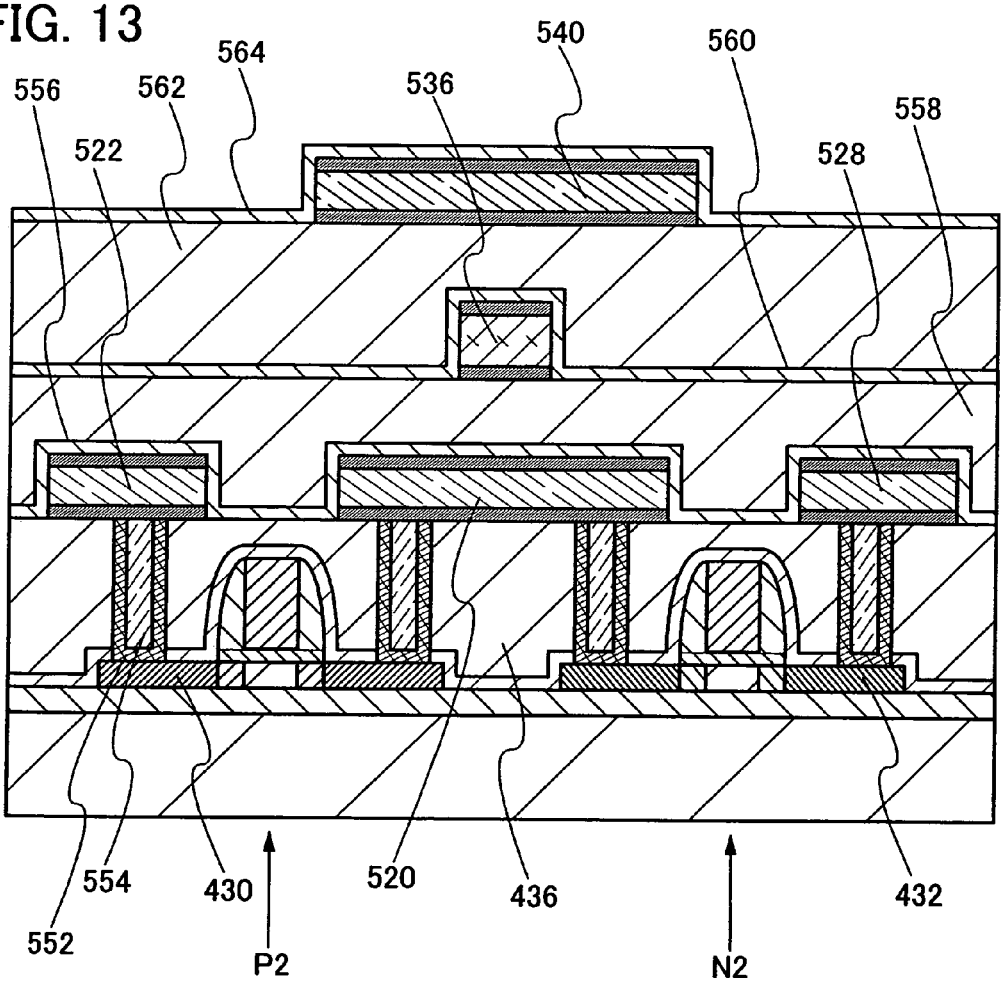
FIG. 13 illustrates a manufacturing process of a semiconductor device in accordance with Embodiment Mode 2.

FIG. 13 shows a structure in which embedded conductive layers 554 are formed in the contact holes C26, C27, C29, and C30, and first wiring layers 520, 522, and 528 are formed. As the embedded conductive layers 554, tungsten can be typically used. In the contact holes C26, C27, C29, and C30, a titanium nitride film or a stack of a titanium film and a titanium nitride film is preferably deposited as an adhesive layer 552, upon which a tungsten film is deposited as the embedded conductive layer 554. The tungsten film is formed by chemically reducing a $WF_6$ gas with hydrogen or disilane. Alternatively, the tungsten film may be formed by a sputtering method. After that, the tungsten film is planarized by etch back with an $SF_6$ gas or by chemical mechanical polishing, thereby forming the embedded conductive layers 554. After that, the first wiring layers 520, 522, and 528 are formed to contact the respective embedded conductive layers 554.

A fifth insulating layer 556 is formed as a passivation layer over the first wiring layers 520, 522, and 528, using a silicon nitride film or the like. A sixth insulating layer 558 is formed by a vapor growth method such as plasma CVD or thermal CVD or a sputtering method, using silicon oxide, silicon oxynitride ($SiO_xN_y$) (x>y>0), silicon nitride oxide ($SiN_xO_y$) (x>y>0), or the like. Alternatively, the sixth insulating layer 558 can be formed to have a single-layer structure or a stacked-layer structure of an organic material such as polyimide, polyamide, polyvinyl phenol, benzocyclobutene, acrylic, or epoxy; a siloxane material such as a siloxane resin; oxazole resin; and the like. Such resin materials are preferably a thermal-curing type or a photo-curing type, and formed by a spin coating method. By using a spin coating method, irregularities of the wiring layers below the sixth insulating layer 558 can be reduced, and thus the surface of the sixth insulating layer 558 can be planarized.

After that, the second wiring layer 536, a seventh insulating layer 560 serving as a passivation layer, an eighth insulating layer 562 serving as a planarization layer, and the third wiring layer 540 are formed in a similar way. Note that it is also possible to use a lithography process with a phase-shift mask for formation of the contact holes C31 to C40 for forming the contacts between the second wiring layers and the first wiring layers, and the contact holes C41 and C42 for forming the contacts between the third wiring layers and the first wiring layers.

As described above, Embodiment Mode 2 illustrates a manufacturing process of the p-channel transistor P2 and the n-channel transistor N2 which are included in the circuit layout shown in FIG. 11. It is also possible to form other transistors in a similar way. Note that this embodiment mode illustrates an example of using a phase-shift mask for formation of gate electrodes and contact holes. However, a lithography process using such a phase-shift mask can have a similar effect even when it is applied to formation of one of the gate electrodes and the contact holes, in terms of improving the degree of integration. Furthermore, a phase-shift mask can also be applied to a lithography process which is required for forming a semiconductor layer or a wiring layer.

Figure 14:
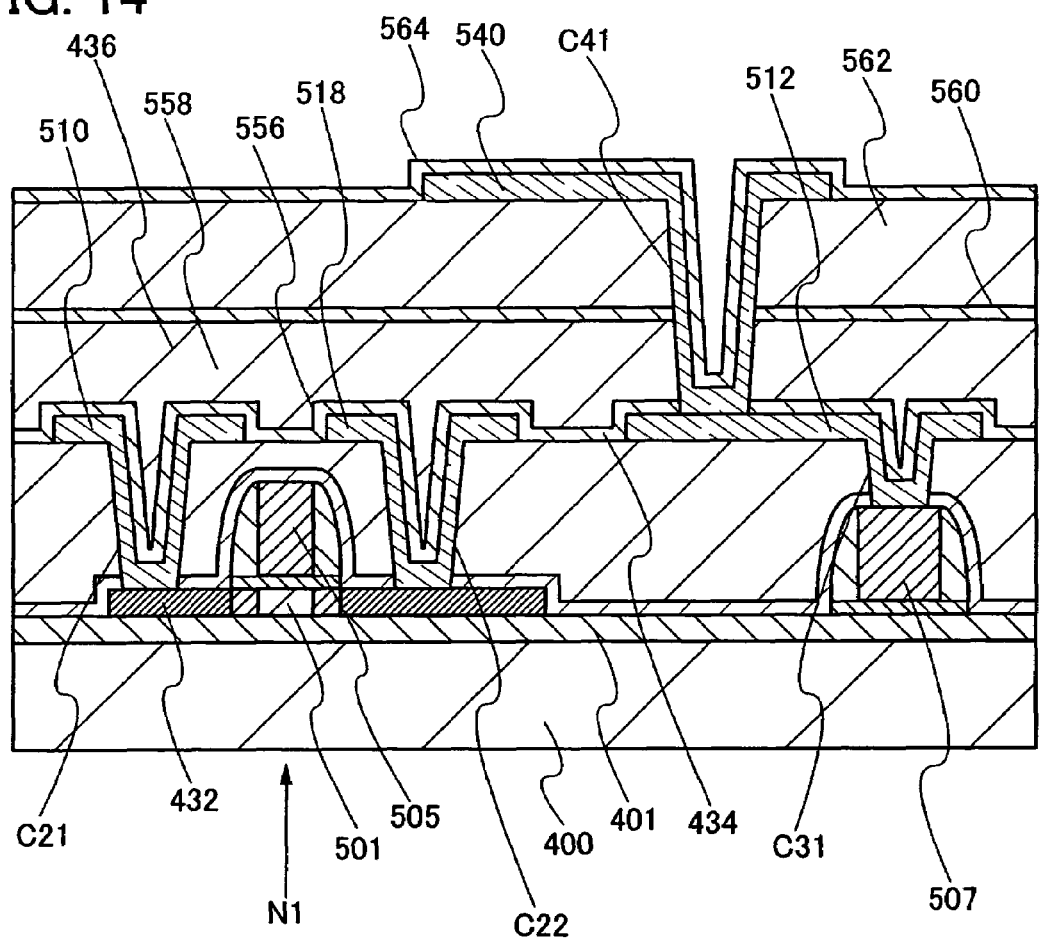
FIG. 14 illustrates a manufacturing process of a semiconductor device in accordance with Embodiment Mode 2.

FIG. 14 shows an example of filling a contact hole with a material for forming an insulating layer without forming embedded conductive layers. A cross-sectional structure shown in FIG. 14 corresponds to a line G-H of FIG. 11.

Referring to FIG. 14, the n-channel transistor N1 has a similar structure to the n-channel transistor N2 shown in FIG. 13. The contact holes C21, C22, and C31 which penetrate the third insulating layer 434 and the fourth insulating layer 436 to expose the n-type impurity region 432 and the gate electrode layer 507 can be formed by forming a mask layer using a phase-shift-mask and conducting etching, similarly to FIG. 12.

The first conductive layers 510, 512, and 518 are formed to have a single-layer structure or a stacked-layer structure of an element selected from aluminum, tungsten, titanium, tantalum, molybdenum, nickel, and neodymium (Nd), or an alloy containing a plurality of such elements. For example, an aluminum alloy containing titanium, silicon, or neodymium can be used as a conductive film which is made of an alloy containing a plurality of the above-described elements. The first wiring layer 510 is a wiring for connecting the n-channel transistor N1 to the second wiring layer 530 which is a ground potential line (GND). The first wiring layer 518 is a wiring for connecting the n-channel transistor N1 to a drain of the p-channel transistor P1. The first wiring layer 512 is a wiring for connecting the gate electrode layer 507 of the switch S1 to the third wiring layer 540 which is the word line.

The contact hole 41 for connecting the first wiring layer 512 to the third wiring layer 540 penetrates the fifth insulating layer 556, the sixth insulating layer 558, the seventh insulating layer 560, and the eighth insulating layer 562. Even in the case of forming such deep contact holes, the lithography process using the phase-shift mask can be conducted. Although FIG. 14 shows the n-channel transistor N1, other transistors shown in FIG. 11 can be formed in a similar way.

Embodiment Mode 3

Instead of performing the phase-shift lithography illustrated in Embodiment Modes 1 and 2, holographic lithography can be performed. By using holographic lithography for formation of gate electrodes and/or contact holes, miniaturization of transistors can be achieved as well as a gate pitch (intervals between contact holes) can be narrowed.

In that case, it is possible to use a holographic lithography technique for formation of gate electrodes and use a lithography process with a phase-shift mask for formation of contact holes. While the holographic lithography can form micropatterns, it involves a large number of masks and high cost. The same can be said for a computer-generated hologram mask. On the other hand, by combining the holographic lithography technique with the lithography process using the phase-shift mask, it becomes possible to minimize the increase of mask cost and decrease of throughput. Therefore, formation of micropatterns and high productivity can be ensured.

Embodiment Mode 4

It is also possible to provide a phase shifter on a hologram mask which is used for holographic lithography. Since a hologram mask records data on the phase of light, a mask pattern with a sharp edge may be formed by adopting the principle of a phase-shift mask. Accordingly, a mask layer with even smaller micropatterns can be formed.

Embodiment Mode 5

Although Embodiment Modes 1 to 4 have illustrated examples of an SRAM circuit, the invention is not limited to them, and various configurations of integrated circuits can be applied to the manufacture of a semiconductor device. For example, a function of decoding an encoded instruction can be provided to a semiconductor device which can perform transmission/reception of instructions or data with radio signals.

Figure 15:
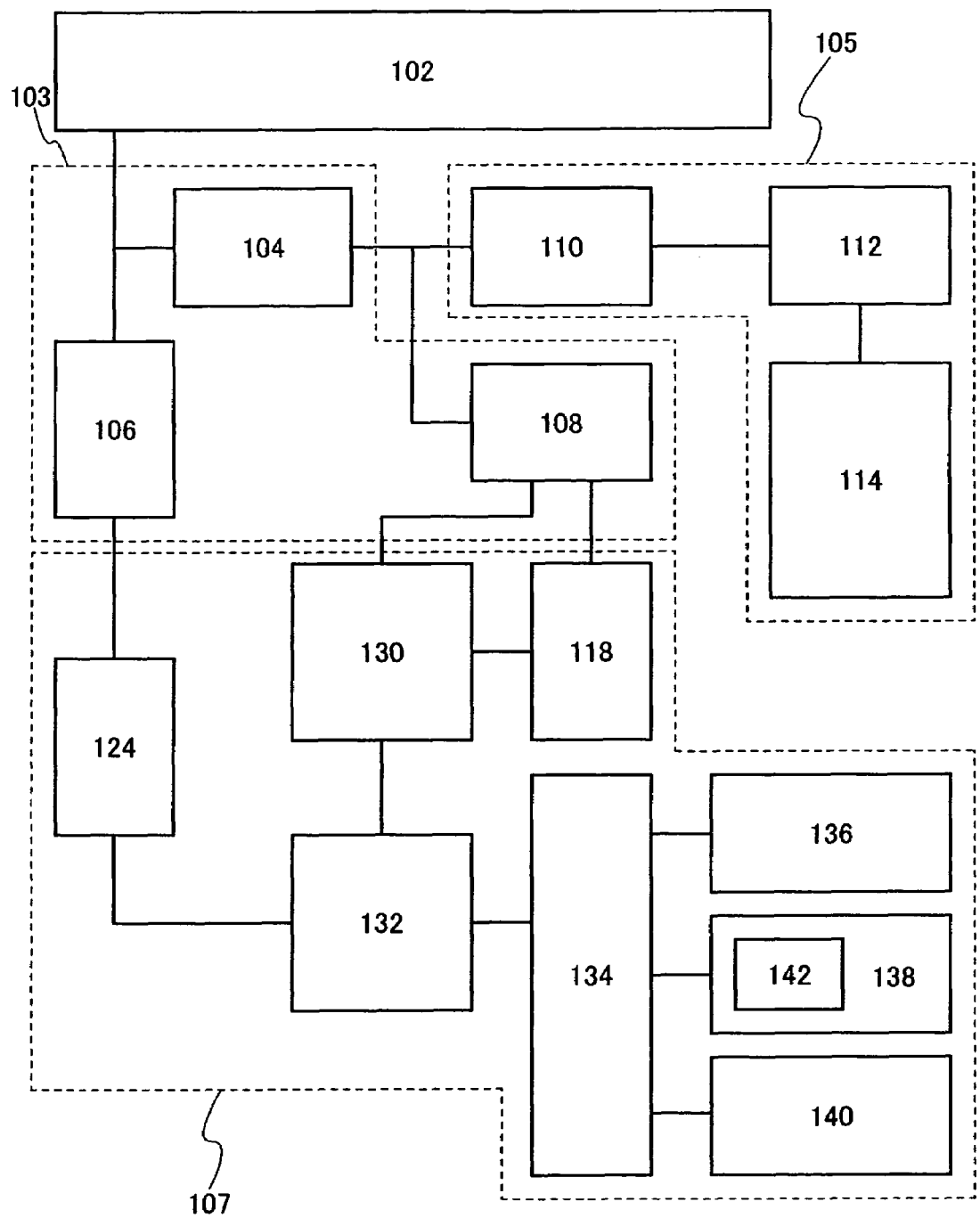
FIG. 15 is a block diagram showing an exemplary configuration of a semiconductor device which has a function of decoding an encoded instruction.

FIG. 15 shows a block diagram showing a configuration of such a semiconductor device. This semiconductor device includes an antenna portion 102, an RF circuit portion 103, a power supply circuit portion 105, and a logic circuit portion 107. Note that elements common to FIG. 1 and FIG. 15 are denoted by common reference numerals, and thus description thereof is omitted.

In FIG. 15, the logic circuit portion 107 includes a PLL circuit portion 118, a code extraction circuit 130, a control register 132, a CPU interface 134, a CPU (Central Processing Unit) 136, a ROM (Read Only Memory) 138, a RAM (Random Access Memory) 140, and an encoding circuit portion 124.

In the semiconductor device shown in FIG. 15, a signal received at the antenna portion 102 is demodulated by a demodulation circuit portion 108 and decomposed into a control command, ciphertext data, and the like in the code extraction circuit 130. Operation of the semiconductor device functioning as a wireless chip in this embodiment mode is described below. First, the semiconductor device receives a signal containing a control command or ciphertext data from a reader/writer. The control command or the ciphertext data contained in the signal is stored in the control register 132. The control command specifies transmission of unique ID numbers, operation halt, decryption, and the like.

When the semiconductor device receives a control command indicative of decryption, the CPU 136 decrypts (decodes) the ciphertext with a private key 142 which is stored in the ROM 138 in advance. The decoded ciphertext (decoded text) is stored in the control register 132. At this time, the RAM 140 is used as a data storage area. Note that the CPU 136 accesses each of the ROM 138, the RAM 140, and the control register 132 through the CPU interface 134. The CPU interface 134 has a function of generating an access signal for accessing one of the ROM 138, the RAM 140, and the control register 132 in accordance with the address specified by the CPU 136. In the case of transmitting data, data to be transmitted is produced from a decoded text in the encoding circuit portion 124. Then, the data to be transmitted is modulated in a modulation circuit portion 106 and transmitted through the antenna portion 102.

Although a data processing method by software control, that is a method of executing programs with a CPU by constructing an arithmetic circuit using a CPU and a large-scale memory is described as an operation method of the semiconductor device shown in FIG. 15, any optimal operation method can be employed in accordance with the intended purpose and circuits may be constructed based on the method. For example, a data processing method by hardware control or a data processing method by both hardware and software control can be considered as alternative operation methods. In the data processing method by hardware control, an arithmetic circuit may be constructed from a dedicated circuit. In the data processing method by both hardware and software control, an arithmetic circuit may be constructed from a dedicated circuit, a CPU, and a memory, so that a part of arithmetic operations can be performed with the dedicated circuit, while the rest of arithmetic operations can be performed with the CPU.

FIG. 15 includes the RF circuit portion 103 and the power supply circuit portion 105 that are analog circuits in addition to the logic circuit portion 107. Such circuits can be constructed from integrated circuits by using a phase-shift lithography method or a holographic lithography method as described in Embodiment Modes 1 to 4. By using such a lithography method, the size of transistors can be reduced as well as the chip size can be reduced even in the case of using a glass substrate or the like having low planarity.

Figure 16:
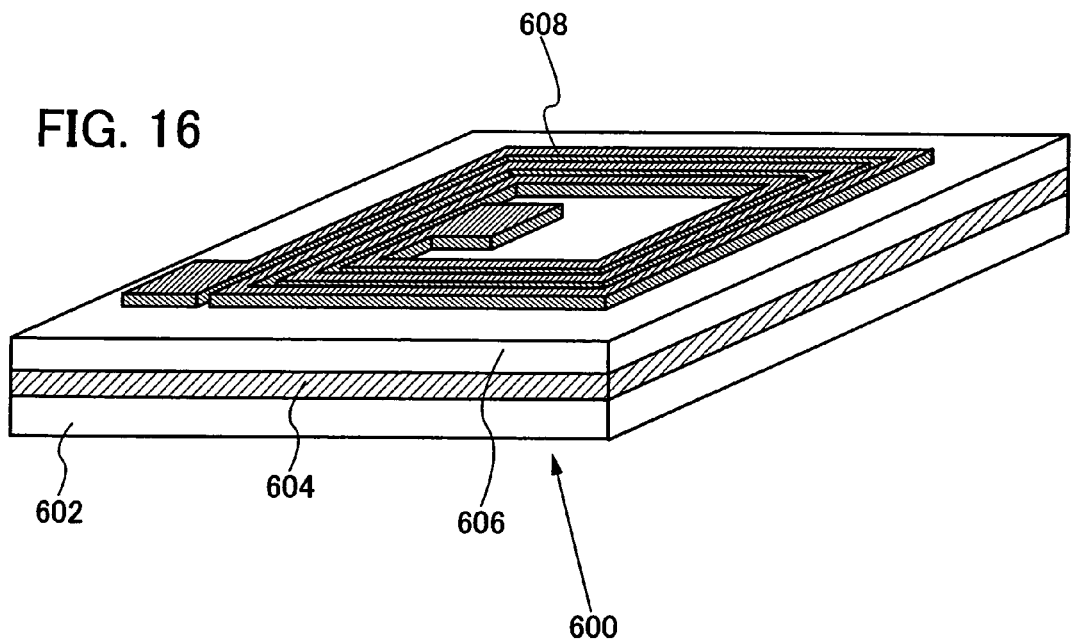
FIG. 16 is a perspective view illustrating a mode of a semiconductor device in which an antenna is formed over a chip.

FIG. 16 shows an example of forming the RF circuit portion 103, the power supply circuit portion 105, the logic circuit portion 107, and the antenna portion 102 shown in FIG. 15 over a substrate 602. An antenna 608 formed over a planarization layer 606 is a loop antenna which is mainly used for HF bands typified by 13.56 MHz. The antenna 608 can also be formed as a dipole antenna or a patch antenna in the case of using UHF bands (900 to 960 MHz) or microwave bands. In an element formation layer 604, circuits including transistors and wiring structures described in Embodiment Mode 1 or 2 is formed. In this case, when integrated circuits are formed by using a phase-shift lithography method or a holographic lithography method, the size of the substrate 602 can be reduced down to 10 mm$^2$ or less, or preferably 5 mm$^2$ or less.

Figure 17A:
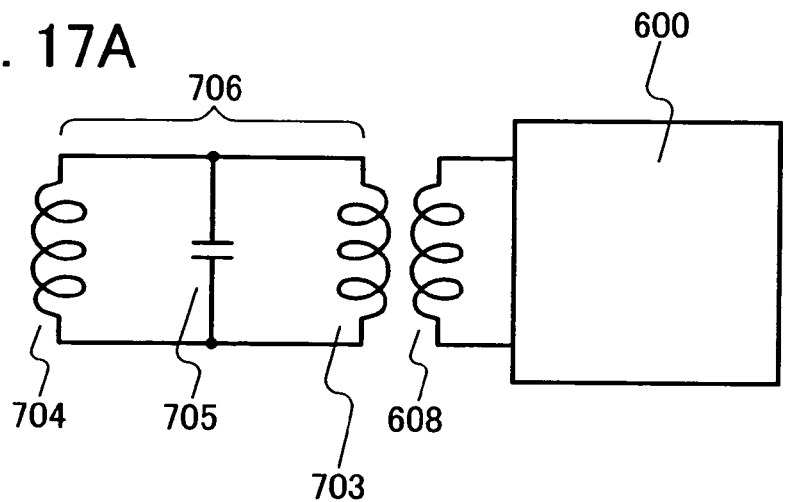
FIGS. 17A to 17C illustrate exemplary configurations for increasing a communication distance of a semiconductor device which can perform transmission/reception of instructions or data with radio signals.
Figure 17B:
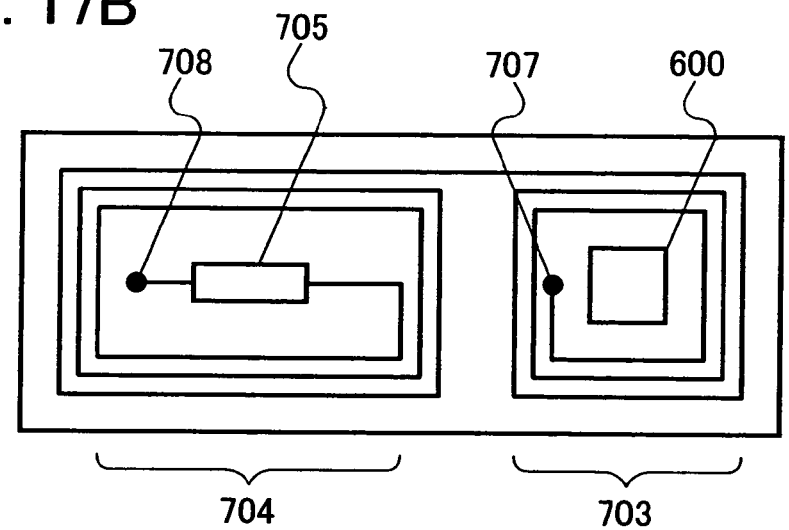
Figure 17C:
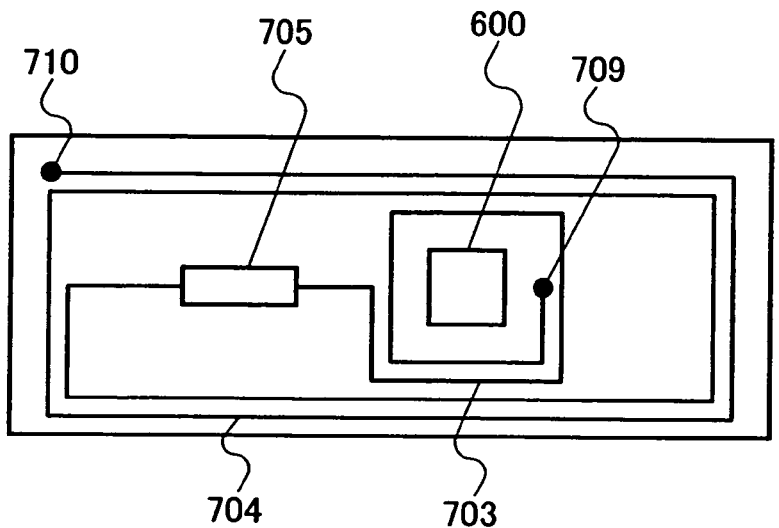

FIGS. 17A to 17C show exemplary configurations for increasing a communication distance of such a semiconductor device 600 which can perform transmission/reception of instructions or data with radio signals. FIG. 17A is a circuit diagram showing the relationship between the semiconductor device 600 and a communication device 706. A second antenna 703, a third antenna 704, and a capacitor 705 are shown as the antenna in addition to the antenna 608 mounted on the semiconductor device 600.

When the third antenna 704 receives a communication signal from a reader/writer, induced electromotive force is generated in the third antenna 704 by electromagnetic induction. By this induced electromotive force, an induction field is generated in the second antenna 703. When the first antenna 608 receives the induction field, the antenna 608 generates induced electromotive force by electromagnetic induction.

The induction field that the first antenna 608 receives can be increased by increasing the inductance of the third antenna 704. That is, a sufficient induction field can be supplied to operate the semiconductor device 600 even when the inductance of the first antenna 608 is small. When the first antenna 608 is formed as an on-chip antenna, the inductance of the first antenna 608 cannot be increased much because of a small area of the semiconductor device 600. Therefore, it is difficult to increase the communication distance of the semiconductor device 600 by using only the first antenna 608. However, the communication distance of the semiconductor device 600 can be increased by adopting the structure in FIG. 17A.

FIG. 17B illustrates an exemplary layout of an antenna included in the semiconductor device in this embodiment mode. FIG. 17B shows an example of forming the second antenna 703 outside the third antenna 704. A first through-hole 707 and a second through-hole 708 are electrically connected to each other. An external antenna is formed from the second antenna 703, the third antenna 704, and the capacitor 705. The capacitor 705 can be a chip capacitor, a film capacitor, or the like. By using the layout shown in FIG. 17B, an antenna with a narrow width can be formed, which is effective in providing a semiconductor device with a narrow width.

FIG. 17C shows another exemplary layout of an antenna included in the semiconductor device in this embodiment mode. FIG. 17C shows an example of forming the second antenna 703 inside the third antenna 704. A first through-hole 709 and a second through-hole 710 are electrically connected to each other. An external antenna is formed from the second antenna 703, the third antenna 704, and the capacitor 705. The capacitor 705 can be a chip capacitor, a film capacitor, or the like. By using the layout shown in FIG. 17C, an antenna with a narrow width can be formed, which is effective in providing a semiconductor device with a narrow width. With such a structure, a high-performance semiconductor device with a longer communication distance can be provided.

Figure 19:
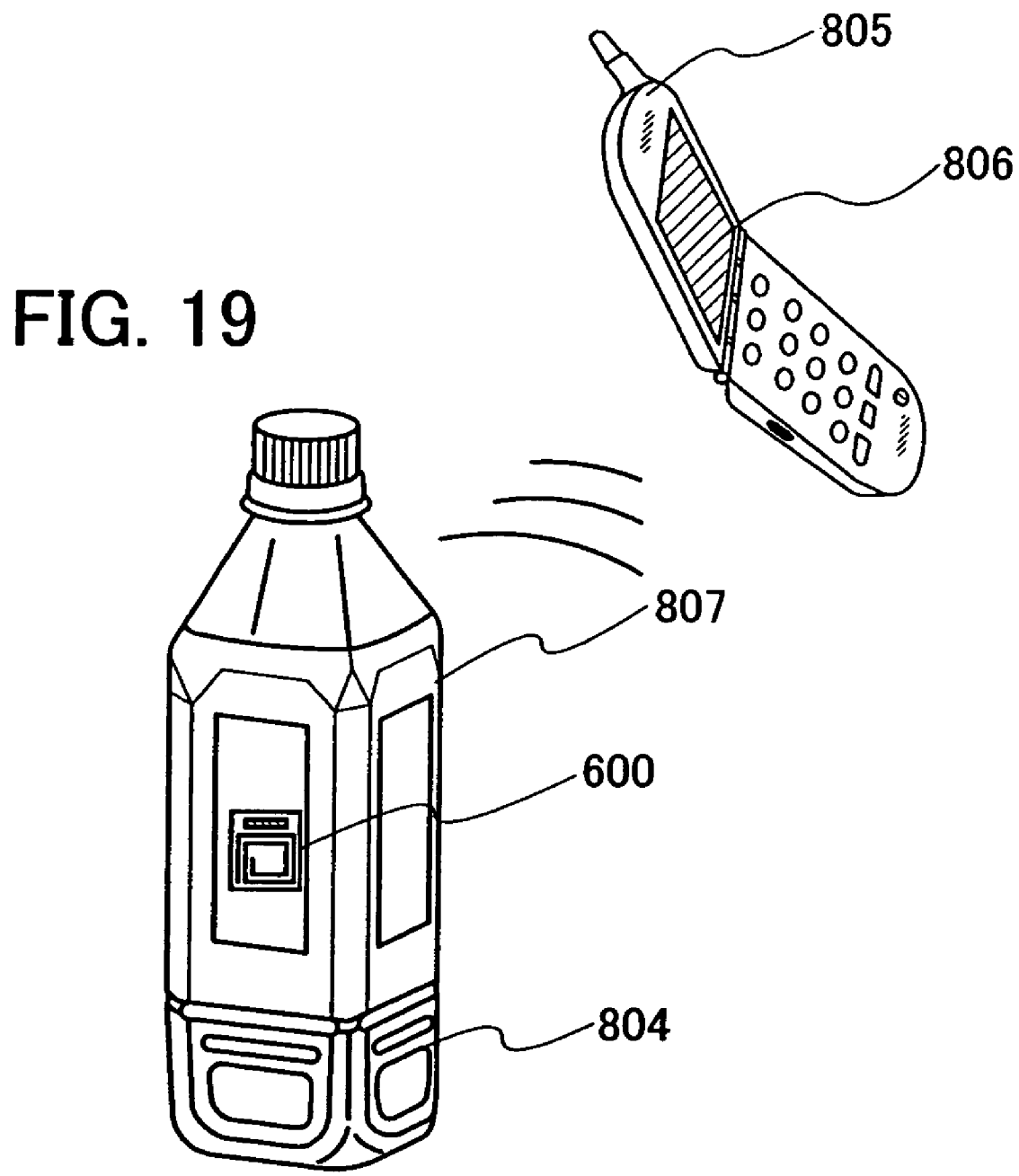
FIG. 19 illustrates an application example of a semiconductor device.
Figure 20:
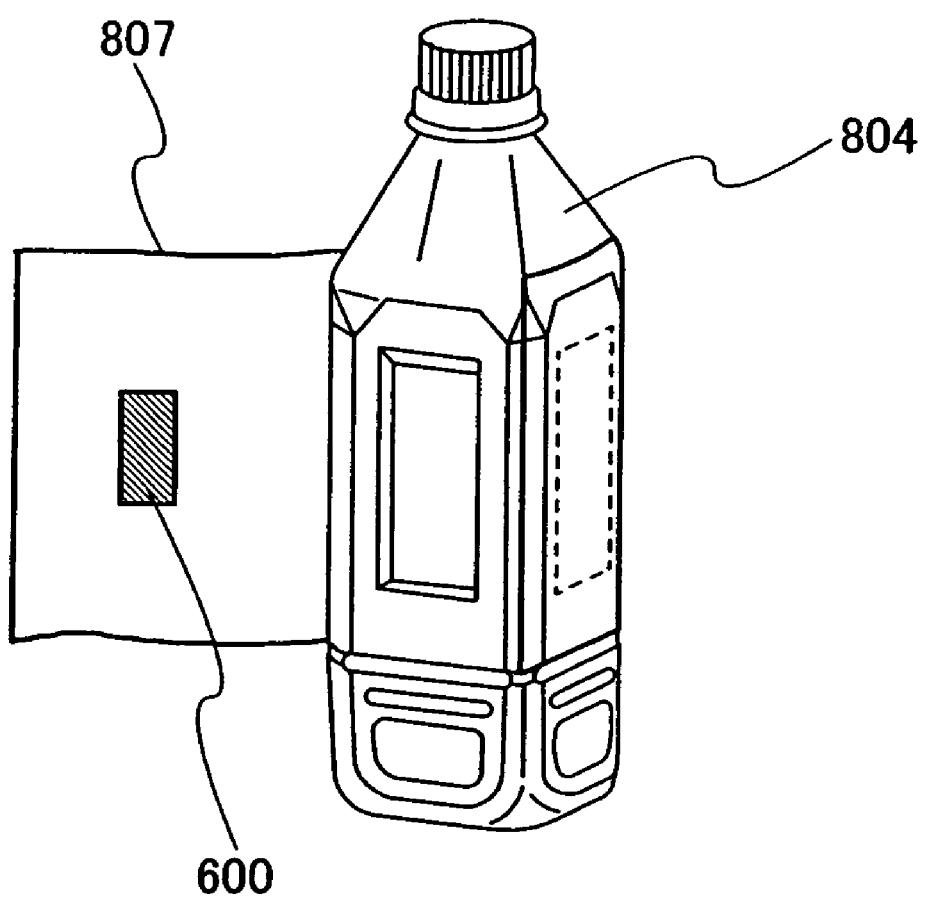
FIG. 20 illustrates an application example of a semiconductor device.

FIG. 19 shows an application example of such a semiconductor device 600, where the semiconductor 600 contained in a container 804 is communicated with an information terminal 805. The container 804 can be made of plastic like a plastic bottle or can be made of glass. The semiconductor device 600 is attached to an inner side of the container 804 or floated in the content. Alternatively, the semiconductor device 600 may be attached to a label 807 of the container 804. In that case, the semiconductor device 600 is preferably provided on the opposite side of the print surface of the label 807. Alternatively, it can be incorporated in the label 807 to obtain a thin shape by forming functional circuits with TFTs. The information terminal 805 is a mobile phone or a mobile computer having a communication function, which preferably has a storage medium and a display portion.

FIG. 19 shows an example where the semiconductor device 600 is communicated with a mobile phone as the information terminal 805. By controlling the information terminal 805 to operate the semiconductor device 600, the condition of an object contained in the container 804 is detected, and information on the content is displayed on a display portion of the information terminal 805. In addition, a record of the product can be checked by reading out the data recorded in the semiconductor device 600. For example, it is possible to check whether the content of the container 804 has deteriorated due to high temperatures as a result of being exposed to direct sunlight. When ID information of the product is recorded in the semiconductor device 600, it becomes also possible to check what is inside the semiconductor device 600.

The present application is based on Japanese Priority application No. 2005-379783 filed on Dec. 28, 2005 with the Japanese Patent Office, the entire contents of which are hereby incorporated by reference.

What is claimed is:

1. A manufacturing method of a semiconductor device, comprising the steps of:
    forming a gate electrode;
    forming an insulating layer over the gate electrode;
    forming an opening in the insulating layer;
    forming a wiring layer over the insulating layer and in the opening,
    wherein the step of forming the opening in the insulating layer is conducted by a lithography process using a phase-shift mask comprising a light-shielding film having a first opening and a light-transmissive substrate with a phase shifter therebetween having a second opening, and
    wherein the first opening of the light-shielding film and the second opening of the phase shifter overlap each other, and the first opening is larger than the second opening.

2. The manufacturing method of a semiconductor device according to claim 1, wherein the lithography process using the phase-shift mask is conducted with a magnification ratio of equal to or more than 1:1.

3. The manufacturing method of a semiconductor device according to claim 1, further comprising the steps of:
    forming the gate electrode over a substrate having an insulating surface,
    wherein the substrate is processed by the lithography process, and is a glass substrate.

4. A manufacturing method of a semiconductor device, comprising the steps of:
    forming a semiconductor layer over a substrate having an insulating surface;
    forming a gate electrode over a semiconductor layer with an insulating layer interposed therebetween;
    forming an interlayer insulating layer over the gate electrode;
    forming a contact hole in the interlayer insulating layer; and
    forming a wiring layer over the interlayer insulating layer and in the contact hole,
    wherein the step of forming the contact hole is conducted by a lithography process using a phase-shift mask comprising a light-shielding film having a first opening and a light-transmissive substrate with a phase shifter therebetween having a second opening, and
    wherein the first opening of the light-shielding film and the second opening of the phase shifter overlap each other, and the first opening is larger than the second opening.

5. The manufacturing method of a semiconductor device according to claim 4, further comprising the steps of:
    forming a second wiring layer over the wiring layer with a second interlayer insulating layer interposed therebetween; and
    forming a contact hole in the second interlayer insulating layer,
    wherein the step of forming the contact hole in the second interlayer insulating layer is conducted by a lithography process using a phase-shift mask.

6. The manufacturing method of a semiconductor device according to claim 4, further comprising the steps of:
    forming a second wiring layer over the wiring layer with a second interlayer insulating layer interposed therebetween; and
    forming a contact hole in the second interlayer insulating layer,
    wherein the step of forming the contact hole in the second interlayer insulating layer is conducted by a lithography process using a hologram mask.

7. The manufacturing method of a semiconductor device according to claim 4, wherein the lithography process using the phase-shift mask is conducted with a magnification ratio of equal to or more than 1:1.

8. The manufacturing method of a semiconductor device according to claim 4, wherein the substrate is processed by the lithography process, and is a glass substrate.

9. A manufacturing method of a semiconductor device, comprising the steps of:
    forming a semiconductor layer over a substrate having an insulating surface;
    forming a gate electrode over a semiconductor layer with an insulating layer interposed therebetween;
    forming an interlayer insulating layer over the gate electrode;
    forming a contact hole in the interlayer insulating layer; and forming a wiring layer over the interlayer insulating layer and in contact with the semiconductor layer via the contact hole, wherein the step of forming the contact hole is conducted by a lithography process using a phase-shift mask comprising a light-shielding film having a first opening and a light-transmissive substrate with a phase shifter therebetween having a second opening, and wherein the first opening of the light-shielding film and the second opening of the phase shifter overlap each other, and the first opening is larger than the second opening.

10. The manufacturing method of a semiconductor device according to claim 9, further comprising the steps of:

forming a second wiring layer over the wiring layer with a second interlayer insulating layer interposed therebetween; and forming a second contact hole in the second interlayer insulating layer, wherein the step of forming the second contact hole in the second interlayer insulating layer is conducted by a lithography process using a phase-shift mask.

11. The manufacturing method of a semiconductor device according to claim 9, further comprising the steps of:

forming a second wiring layer over the wiring layer with a second interlayer insulating layer interposed therebetween; and forming a second contact hole in the second interlayer insulating layer, wherein the step of forming the second contact hole in the second interlayer insulating layer is conducted by a lithography process using a hologram mask.

12. The manufacturing method of a semiconductor device according to claim 9, wherein the lithography process using the phase-shift mask is conducted with a magnification ratio of equal to or more than 1:1.

13. The manufacturing method of a semiconductor device according to claim 9, wherein the substrate is a glass substrate.

* * * * *